(12) United States Patent
Urzhumov

(10) Patent No.: US 10,992,325 B2
(45) Date of Patent: Apr. 27, 2021

(54) OPEN CAVITY SYSTEM FOR DIRECTED AMPLIFICATION OF ACOUSTIC SIGNALS

(71) Applicant: Elwha LLC, Bellevue, WA (US)

(72) Inventor: Yaroslav Urzhumov, Bellevue, WA (US)

(73) Assignee: Elwha LLC, Bellevue, WA (US)

( * ) Notice: Subject to any disclaimer, the term of this patent is extended or adjusted under 35 U.S.C. 154(b) by 478 days.

(21) Appl. No.: 16/121,059

(22) Filed: Sep. 4, 2018

(65) Prior Publication Data

US 2020/0076457 A1 Mar. 5, 2020

(51) Int. Cl.
| | |
|---|---|
| *H04B 1/04* | (2006.01) |
| *H03F 1/02* | (2006.01) |
| *H01Q 1/36* | (2006.01) |
| *H01Q 3/26* | (2006.01) |

(52) U.S. Cl.
CPC ............ *H04B 1/0458* (2013.01); *H01Q 1/36* (2013.01); *H01Q 3/267* (2013.01); *H03F 1/02* (2013.01)

(58) Field of Classification Search
CPC ...... H04B 1/0458; H04B 11/00; H01Q 3/267; H01Q 1/36; H03F 1/02
See application file for complete search history.

(56) References Cited

U.S. PATENT DOCUMENTS

| | | |
|---|---|---|
| 6,657,580 B1 | 12/2003 | Edwards et al. |
| 6,876,337 B2 | 4/2005 | Thomas |
| 2009/0284431 A1 | 11/2009 | Meharry et al. |
| 2011/0086598 A1 | 4/2011 | Ali et al. |
| 2013/0135159 A1 | 5/2013 | Goebel et al. |
| 2016/0087391 A1 | 3/2016 | Della-Pergola et al. |
| 2016/0329754 A1 | 11/2016 | Alpert et al. |
| 2017/0018976 A1 | 1/2017 | Mor et al. |
| 2017/0063344 A1 | 3/2017 | Broyde et al. |
| 2017/0133816 A1 | 5/2017 | Della-Pergola et al. |
| 2017/0294809 A1 | 10/2017 | Slepoy et al. |

(Continued)

FOREIGN PATENT DOCUMENTS

WO   WO-2020051120 A1 * 3/2020 ............... H01Q 1/36

OTHER PUBLICATIONS

Barret et al., John P.; "Active nonlinear metamaterials loaded with negative differential resistance elements and circuits", Dept of Electrical and Computer Engineering and Center for Metamaterials and Integrated Plasmonics, Proc. of SPIE vol. 8455, 2012.

(Continued)

*Primary Examiner* — Daniel Pihulic

(57) ABSTRACT

An apparatus is provided for transmission of acoustic signals between a transmitter and a receiver. The apparatus includes an electrical signal generator for generating low frequency electrical signals. The apparatus also includes a transmitter comprising a first retroreflector having a first array of subwavelength retroreflective elements at one end of an open cavity for transmitting the low frequency electrical signals and a first electroacoustic transducer adjacent to the first retroreflector for converting the low frequency electrical signals to acoustic signals. The apparatus further includes a receiver comprising a second retroreflector having a second array of subwavelength retroreflective elements at an opposite end of the open cavity, the acoustic signals being in form of a beam directed toward the receiver.

40 Claims, 9 Drawing Sheets

(56) References Cited

U.S. PATENT DOCUMENTS

| | | |
|---|---|---|
| 2017/0358958 A1 | 12/2017 | Mor et al. |
| 2017/0373543 A1 | 12/2017 | Alpert et al. |
| 2018/0019565 A1 | 1/2018 | Alpert et al. |
| 2018/0034321 A1 | 2/2018 | Tole et al. |
| 2018/0034557 A1 | 2/2018 | Alpert et al. |
| 2018/0132970 A1 | 5/2018 | Ritter |
| 2018/0152055 A1 | 5/2018 | Slepoy et al. |
| 2020/0076457 A1* | 3/2020 | Urzhumov ............... H03F 1/02 |

OTHER PUBLICATIONS

Bergman et al., David J.; "Surface Plasmon Amplification by Stimulated Emission of Radiation: Quantum Generation of Coherent Surface Plasmons in Nanosystems", The American Physical Society, vol. 90, No. 2, Jan. 17, 2003.

Boyarsky et al., Michael; "Alternative synthetic aperture radar (SAR) modalities using a 1D dynamic metasurface antenna", Proc. of SPIE vo. 10189, May 11, 2017.

Boyarsky et al., Michael; "Single-frequence 3D synthetic aperture imaging with dynamic metasurface antennas", Optical Society Society of America, vol. 57, No. 15, May 20, 2018.

Boyarsky et al., Michael; "Synthetic aperture radar with dynamic metasurface antennas: a conceptual development", Journal of the Optical Society of America A, vol. 34, No. 5, May 2017.

Chen et al., Hongsheng; "Special issue on transformation optics", Journal of Optics 18 (2016) 040201 (3pp).

Chen et al. Hou-Tong; "Active terahertz metamaterial devices", Nature Publishing Group, vol. 444 | Nov. 2006 | doi:10.1038/nature05343.

Chen, Pai-Yen; Alu, Andrea; "Subwavelength Imaging Using Phase-Conjugating Nonlinear Nanoantenna Arrays", Nano Letters, Nov. 16, 2011.

Ciraci et al., Cristian; "Hydrodynamic Model for Plasmonics: A Macroscopic Approach to a Microscopic Problem", ChemPhysChem 2013.

Culver, Dean; Urzhumov, Yaroslav; "Forced underwater laminar flows with active magnetohydrodynamic metamaterials", American Physical Society, Physical Review E 96, 063107 (2017).

Cummer et al., Steven A.; "Material parameters and vector scaling in transformation acoustics", New Journal of Physics 10 (2008) 115025 (12pp), Nov. 27, 2008.

Driscoll et al., T.; "Dynamic tuning of an infrared hybrid-metamaterial resonance using vanadium dioxide", Applie Physics Letters 93, 024101 (2008), Jul. 14, 2008.

Driscoll et al., T.; "Hybrid metamaterials for dynamic tuning", The American Physical Society, Dec. 14, 2007.

Fleury et al., Romain; "Negative Refraction and Planar Focusing Based on Parity-Time Symmetric Metasurfaces", Physical Review Letters, PRL 113, 023903, Jul. 11, 2014.

Fu et al, Yangyang; "Coherent perfect absorption and laser modes in a cylindrical structure of conjugate metamaterials", New Journal of Physics, Jan. 9, 2018.

Goldflam et al., M.D.; "Reconfigurable Gradient Index using VO2 Memory Metamaterials", Appl. Phys. Lett., Mar. 30, 2011.

Hand et al., Thomas H.; "A Dynamic Frequency Selective Surface Using Addressable Metamaterials", 2009 IEEE Antennas and Propagation Society International Symposium.

Hand, Thomas; "Characterization of Tunable Metamaterial Elements Using MEMS Switches", IEEE Antennas and Wireless Propagation Letters, vol. 6, 2007.

Hand, Thomas; "Reconfigurable Reflectarray Using Addressable Metamaterials", IEEE Antennas and Wireless Propagation Letters, vol. 9, 2010.

Harutyunyan et al., Hayk; "Controllable optical negative refraction and phase conjugation in graphite thin films", Nature Physics | vol. 9 | Jul. 2013.

Hunt et al., John; "Broadband Wide Angle Lens Implemented with Dielectric Metamaterials", Sensors 2011, 11, 7982-7991; DOI: 10.3390/s110807982.

Hunt et al., John; "Perfect relay lens at microwave frequencies based on flattening a Maxwell lens", Optical Society of America, vol. 28, No. 8 / Aug. 2011 / J. Opt. Sco. Am. B.

Hung et al., John; "Transformation Optics Compressed Rotman Lens Implemented with Complementary Metamaterials", Proc. of SPIE vol. 8021 80210O-7, 2010.

Katko et al., Alexander R.; "Phase Conjugation and Negative Refraction using Nonlinear Active Metamaterials", The American Physical Society, PRL 105, 123905 (2010), Sep. 17, 2010.

Katko et al., Alexander R.; "Phase Conjugation metamaterials: particle design and imaging experiements", Journal of Optics, Jul. 27, 2012.

Katko et al., Alexander R.; "Nonlinear and active RF metamaterial applications using embedded devices", Dept of Electrical and Computer Engineering and Center for Metamaterials and Integrated Plasmonics, Proc of SPIE vol. 8455 84550B-1, 2012.

Knight et al., Mark W.; "Photodetection with Active Optical Antennas", Science 332, 702 (2011); DOI: 10.1126/scienc.1203056.

Kundtz et al., Nathan B.; "Electromagnetic Design With Transformation Optics", Proceedings of the IEEE | vol. 99, No. 10, Oct. 2011.

Landy et al, N.I; "Approaches to Three-Dimensional Transformation Optical Media Using Quasi-Conformal Coordinate Transformations", Physics Optics, Jul. 26, 2010.

Li et al., Yong; "Tunable Asymmetric Transmission vai Lossy Acoustic Metasurfaces", American Physical Society, PRL 119, 035501, Jul. 21, 2017.

Maslovski et al., Stanislav; "Perfect lensing with phase-conjugating surfaces: toward practical realization", New Journal of Physics 14, Mar. 13, 2012.

Monticone et al., Francesco; "Parity-Time Symmetric Nonlocal Metasurfaces: All-Angle Negative Refraction and Volumetric Imaging", American Physical Society, Physical Review X6, 041018 (2016).

Paul et al., Oliver; "Construction of invisibility cloaks of arbitrary shape and size using planar layers of metamaterials", Journal of Applied Physics, 2012.

Pedross-Engel et al., Andreas; "Enhanced Resolution Stripmap Mode Using Dynamic Metasurface Antennas", IEEE Transactions on Geoscience and Remote Sensing, Mar. 28, 2017.

Popa et al., Bogdan-Ioan; "Design of layered transformation-optics devices of arbitrary shape", The American Physical Society, Physical Review A 82, 033837 (2010).

Pourtrina, Ekaterina; Smith, David R.; "High-Frequency Active Metamaterials", Dept of Electrical and Computer Engineering, 2009 OSA/CLEO/IQEC 2009.

Rahm et al., M.; "Design of Adaptive Optics by Finite Embedded Coordinate Transformation", Center of Metamaterials and Integrated Plasmonics, 2008.

Rahm et al., M.; "Design of Electromagnetic cloaks and concentrators using form-invariant coordinate transformations of Maxwell's equations", ScieneDirect Photonics and Nanostructures—Fundamentals and Applications 6 (2008) 87-95.

Rahm et al., Marco; "Optical design of reflectionless complex media by finite embedded coordinate transformations", Physics Optics, Dec. 4, 2007.

Roberts et al., D.A.; "Optical lens compression via transformation optics", Optical Society of America, Sep. 14, 2009 | vol. 17, No. 19 | Optics Express.

Rose, Alec; Smith, David R.; "Broadly tunable quasi-phase-matching in nonlinear metamaterials", American Physics Society, Physical Review A 84, 013823 (2011).

Rose, Alec; Smith, David R.; "Control of Radiative Processes Using Tunable Plasmonic Nanopatch Antennas", Nano Letters, Jul. 14, 2014.

Schurig et al., D.; "Calculation of material properties and ray tracing in transformation media", Optical Society of America, vol. 14, No. 21, Oct. 16, 2006.

Schurig et al., D.; "Transformation-designed optical elements", Optical Society of America, Oct. 29, 2007 | vol. 15, No. 22 | Optics Express.

(56) References Cited

OTHER PUBLICATIONS

Sebba et al., David S.; "Reconfigurable Core—Satellite Nano assemblies as Molecularly-Driven Plasmonic Switches", Nano Letters, vol. 8, No. 7, pp. 1803-1808, May 16, 2008.
Shapiro et al., M.A.; "Active negative-index metamaterial powered by an electron beam", American Physical Society, Physical Review B 86, 085132 (2012), DOI: 10.1103/PhysRevB.86.085132.
Shin et al., Dongheok; "A versatile smart transformation optics device with auxetic elasto-electromagnetic metamaterials", Scientific Reports, Feb. 13, 2014.
Shin et al., Dongheok; "Broadband electromagnetic cloaking with smart metamaterials", Nature Communications, Nov. 20, 2012.
Sleasman et al., Timothy; "Design considerations for a dynamic metamaterial aperture for computational imaging at microwave frequencies", Journal of the Optical Society of America B, vol. 33, No. 6 | Jun. 2016.
Sleasman et al., Timothy; "Experimental Synthetic Aperture Radar with Dynamic Metasurfaces", IEEE TAP, vol. pp, No. pp, Jul. 2016.
Sleasman et al., Timothy; "Microwave Imaging Using a Disordered Cavity with a Dynamically Tunbale Impedance Surface", American Physical Society, Nov. 29, 2016.
Sleaseman et al., Timothy; "Reconfigurable metasurface aperture for Computational Imaging", Imaging and Applied Optics 2017.
Sleaseman et al., Timothy; "Reconfigurable metasurface aperture for security screening and microwave imaging", Proc. of SPIE vol. 10189, May 11, 2017.
Sleasman et al., Timothy; "Single-Frequency Microwave Imaging with Dynamic Metasurface Apertures", Journal of the Optical Society of America B, Apr. 14, 2017.
Sleaseman et al., Timothy; "Toward a Tunable Mode-Mixing Cavity for Computational Imaging", IEEE International Symposium on Antennas and Propagation, 2016.
Sleaseman et al., Timothy; "Waveguide-Fed Tunable Metamaterial Element for Dynamic Apertures", IEEE Antennas and Wireless Propagation Letters, vol. 15, 2016.
Smith et al., David R.; "An analysis of beamed wireless power transfer in the Fresnel zone using a dynamic, metasurface aperture", Journal of Applied Physics 121, 014901 (2017).
Smith et al., D.R.; "Electrodynamics of Metallic Photonic Crystals and the Problem of Left-Handed Materials", Physical Review Letters, vol. 92, No. 5, Feb. 6, 2004.
Smith et al., David R.; "Enhancing imaging systems using transformation optics", Optical Society of America, Sep. 27, 2010 / vol. 18 / No. 20 / Optics Express 21238.
Urzhumov et al., Yaroslav A.; "Cross-section comparisons of cloaks designed by transformation optical and optical conformal mapping approaches", Journal of Optics, Nov. 16, 2010.
Urzhumov et al., Yaroslav; "Electronically reconfigurable metal-on-silicon metamaterial", American Physical Society, Physical Review B 86, 075112 (2012), DOI: 10.1103/PhysRevB.86.075112.
Urzhumov et al., Yaroslav; "Low-loss directional cloaks without superluminal velocity or magnetic response", Optical Society of America, Nov. 1, 2012 | vol. 37, No. 21 | Optics Letters.
Urzhumov et al., Yaroslav; "Transformation optics with photonic band gap media", Physics Optics, Jul. 19, 2010.
Urzhumov et al., Yaroslav; "Optical time reversal with graphene", Nature Physics | vol. 9 | Jul. 2013.
Wan et al. N.N.; "Study of active superlens and evanescent wave amplification using an active metamaterial model", The European Physical Journal Applie Physics, 48, 21101 (2009), DOI: 10.1051/epjap/20009141.
Watts et al., Claire M.; "X-band SAR Imaging with a liquid-crystal-based dynamic metasurface antenna", Journal of the Optical Society of America B, vol. 34, No. 2, Feb. 2017.
Werner, Douglas H.; Kwon, Do-Hoon; "Transformation Electromagnetics and Metamaterials, Fundamental Principles and Applications", Springer, ISBN 978-1-4471-4996-5, Jul. 19, 2013.
Yuan et al., Yu; "Zero loss magnetic metamaterials using powered active unit cells", Optical Society of America, Aug. 31, 2009 / vol. 17 / No. 18/ Optics Express 16135.
Yurduseven et al., Okan; "Design and Analysis of a Reconfigurable Holographic Metasurface Aperture for Dynamic Focusing in the Fresnel Zone", IEEE Access, vol. 5, Jun. 6, 2017.
U.S. Appl. No. 15/722,973, entitled "Time Reversal Beamforming Techniques with Metamaterial Antennas," filed Oct. 2, 2017.
U.S. Appl. No. 15/868,215, filed Jan. 11, 2018, entitled "Diffractive Concentrator Structures".
PCT International Search Report; International App. No. PCT/US2019/049300; Dec. 20, 2019; pp. 1-4.

\* cited by examiner

OPEN CAVITY SYSTEM FOR DIRECTED AMPLIFICATION OF ACOUSTIC SIGNALS

If an Application Data Sheet ("ADS") has been filed on the filing date of this application, it is incorporated by reference herein. Any applications claimed on the ADS for priority under 35 U.S.C. §§ 119, 120, 121, or 365(c), and any and all parent, grandparent, great-grandparent, etc. applications of such applications, are also incorporated by reference, including any priority claims made in those applications and any material incorporated by reference, to the extent such subject matter is not inconsistent herewith.

If the listings of applications provided above are inconsistent with the listings provided via an ADS, it is the intent of the Applicant(s) to claim priority to each application that appears in the Domestic Benefit/National Stage Information section of the ADS and to each application that appears in the Priority Applications section of this application.

All subject matter of the Priority Applications and of any and all applications related to the Priority Applications by priority claims (directly or indirectly), including any priority claims made and subject matter incorporated by reference therein as of the filing date of the instant application, is incorporated herein by reference to the extent such subject matter is not inconsistent herewith.

FIELD

This disclosure is directed to an open and dynamically-defined cavity for amplification of acoustic signals.

BACKGROUND

Advances in modern technology, network connectivity, processing power, convenience, and the like, support an ever increasing number of interconnected devices such as mobile devices, cell phones, tablets, smart-cars, wearable devices, etc. In turn, these advances present new challenges and create new opportunities for network operators and third party service providers to efficiently target, communicate, or otherwise exchange signals between networked devices. Indeed, modern approaches for wireless signal transmission must often account for complex conditions and dynamic factors such as network traffic, signal propagation through various media, spectrum/frequency constraints for signal transmission, and the like.

One approach that attempts to address some of these challenges includes beamforming, and more specifically, retroreflector-based beamforming and time reversal beamforming. Beamforming generally refers to a signal processing technique used in sensor arrays for directional signal transmission or reception. With respect to operations for time reversal beamforming, a receiver device temporarily transmits signals that are received by a transmitter device (e.g., beamforming device). The transmitter or beamforming device measures and records amplitudes at its radiating elements, and further applies amplitude and phase modulations to a transmission signal to produce a phase-conjugate signal of the prior measured and recorded field amplitudes. Conventional techniques for acoustic, including ultrasound, beamforming use phased arrays of transducers, also known as Electronically Scanned Arrays (ESA), which are very expensive. The ESAs use a sophisticated control network that defines the phase of each transducer element and also has a phase shifter for each transducer element. There remains a need for developing lower cost techniques.

Techniques and structures for beamforming are disclosed in co-pending U.S. application Ser. No. 15/722,973, entitled "Time Reversal Beamforming Techniques with Metamaterial Antennas," filed on Oct. 2, 2017, U.S. application Ser. No. 15/868,215, filed on Jan. 11, 2018, entitled "Diffractive Concentrator Structures," and U.S. application Ser. No. 16/120,978, filed Sep. 4, 2018, for "Open Cavity System for Directed Amplification of Radio Frequency Signals," all of which are incorporated herein by reference.

BRIEF SUMMARY

In one embodiment, an apparatus is provided for transmission of acoustic signals between a transmitter and a receiver. The apparatus includes an electrical signal generator for generating low frequency electrical signals. The apparatus also includes a transmitter comprising a first retroreflector having a first array of subwavelength retroreflective elements at one end of an open cavity for transmitting the low frequency electrical signals and a first electroacoustic transducer adjacent to the first retroreflector for converting the low frequency electrical signals to acoustic signals. The apparatus further includes a receiver comprising a second retroreflector having a second array of subwavelength retroreflective elements at an opposite end of the open cavity, the acoustic signals being in form of a beam directed toward the receiver.

In one embodiment, an apparatus is provided for exchanging acoustic signals between a first terminal and a second terminal. The apparatus includes a first terminal that includes an electrical signal generator for generating low frequency electrical signals. The first terminal also includes a first retroreflector having a first array of subwavelength retroreflective elements at one end of an open cavity for transmitting the low frequency electrical signals and for receiving the signal returned from the second terminal. The first terminal further includes a first electroacoustic transducer adjacent to the first retroreflector for converting the low frequency electrical signals to acoustic signals. The apparatus also includes a second terminal comprising a second retroreflector having a second array of subwavelength retroreflective elements at an opposite end of the open cavity for returning the transmitted seed signal.

In another embodiment, a transmitting apparatus is provided for transmitting acoustic signals to a matched receiver. The transmitting apparatus includes an electrical signal generator for generating low frequency electrical signals. The transmitting apparatus also includes a transmitter comprising a retroreflector having an array of subwavelength retroreflective elements at one end of an open cavity for transmitting the low frequency electrical signals. The transmitting apparatus further includes an electroacoustic transducer adjacent to the retroreflector for converting the low frequency electrical signals from the transmitter to acoustic signals that travel through the open cavity to the receiver.

In yet another embodiment, a receiving apparatus is provided for receiving acoustic signals from a transmitter. The apparatus includes a receiver comprising a retroreflector having an array of subwavelength retroreflective elements at an opposite end of the open cavity and an electroacoustic transducer adjacent to the retroreflector for converting acoustic signals that travel through the open cavity to low frequency electrical signals that are received by the receiver.

In a further embodiment, a method is provided for designing a retroreflector comprising an array of sub-wavelength elements, wherein the sub-wavelength elements contain volumetric distributions of at least one refractive material, wherein the volumetric distributions are calculated using a numerical algorithm.

Additional embodiments and features are set forth, in part, in the description that follows, and will become apparent to those skilled in the art upon examination of the specification or may be learned by the practice of the disclosed subject matter. A further understanding of the nature and advantages of the present disclosure may be realized by reference to the remaining portions of the specification and the drawings, which form a part of this disclosure.

BRIEF DESCRIPTION OF THE DRAWINGS

The description will be more fully understood with references to the following figures and data graphs, which are presented as various embodiments of the disclosure and should not be construed as a complete recitation of the scope of the disclosure, wherein.

DETAILED DESCRIPTION

The disclosure may be understood by reference to the following detailed description, taken in conjunction with the drawings as described below. It is noted that, for purposes of illustrative clarity, certain elements in various drawings may not be drawn to scale.

Overview

The disclosure provides an open cavity system including an open and dynamically-defined cavity for amplification of acoustic signals delivered from a transmitter at a first end of the open cavity to a receiver at a second end of the open cavity. The second end is opposite to the first end. Each of the first and second ends of the open cavity may be fixed or movable. The transmitter may include a first retroreflector at the first end of the open cavity. The open cavity system includes an amplifier for amplifying the low frequency electric signals from the transmitter and an electroacoustic transducer that converts from the amplified electric signals from the amplifier to acoustic signals. The amplifier includes amplifying elements, such as an amplifying metamaterial, inside the open cavity. The receiver may include a second retroreflector at the second end of the open cavity. The receiver may also include a power absorbing medium inside the open cavity. The open cavity system includes an electroacoustic transducer that converts from acoustic signals to low frequency electric signals, which may go through the power absorbing medium and then are received by the receiver. Each of the first and second retroreflectors includes an array of retroreflective elements.

The acoustic signals typically have much lower frequency than the radio frequency (RF) signals, while the wavelengths of the acoustic signals can be about the same as the wavelength of RF signals. The acoustic signals are elastic, mechanical waves that travel in a compressible medium, such as air, water, crystalline or amorphous or solid, or plasma among others. In contrast, the RF signals are electromagnetic waves that can travel in free (empty) space without any medium. The presence of a medium that supports propagation of acoustic waves is implied whenever an acoustic device is described.

The acoustic signals from the transmitter are directed toward and delivered to the receiver. The open cavity system acts as a resonator and creates a focused beam from the transmitter to the receiver with a high Q-factor.

In some variations, the signals are used to wirelessly transmit power. One of the primary functions of the open cavity system is that energy or signal can be extracted from the open cavity with substantial energy density. The energy extraction can be slow enough such that the high Q-factor would not be significantly reduced. The energy or signal can be then rectified and converted into DC or low frequency AC signals.

Figure 1:
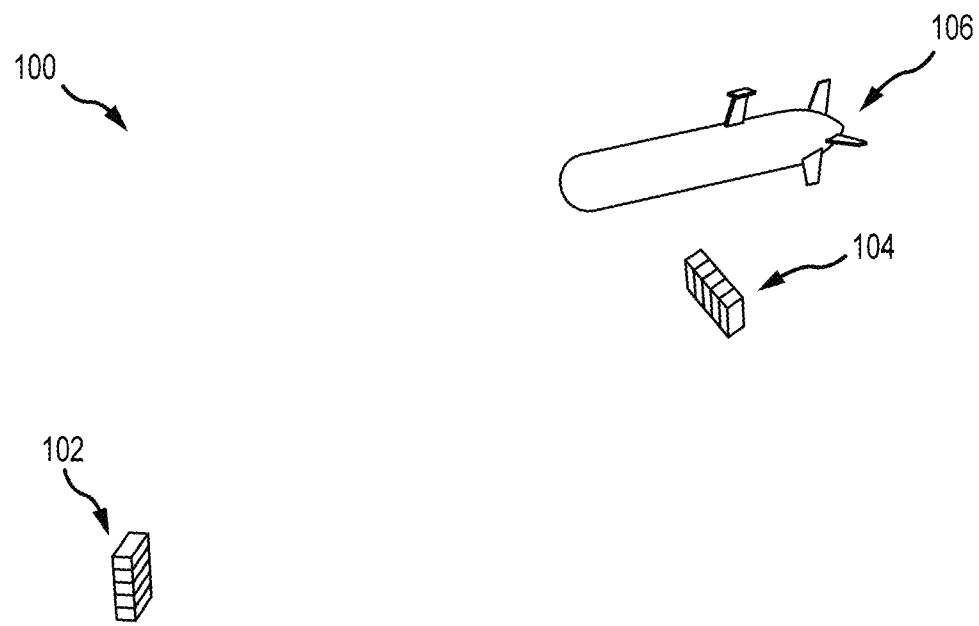
FIG. 1 is a simplified diagram for signal or power transmission to a target in accordance with embodiments of the disclosure.

FIG. 1 is a simplified diagram for signal or power transmission to a target in accordance with embodiments of the disclosure. As shown in FIG. 1, a transducer system 100 includes a transmitter 102 having an array of sub-wavelength transducer elements and a receiver 104 having an array of sub-wavelength transducer elements. The system 100 also includes an intended target 106, such as unmanned underwater vehicle. The transmitter 102 and receiver 104 are configured for wireless transfer of power or signal to the intended target 106. The receiver may be a beamforming receiver including an open cavity system, which has a significantly lower weight than a receiver including a phased array.

In some embodiments, the transmitter 102 and receiver 104 may be sonars for underwater communications.

Figure 2:
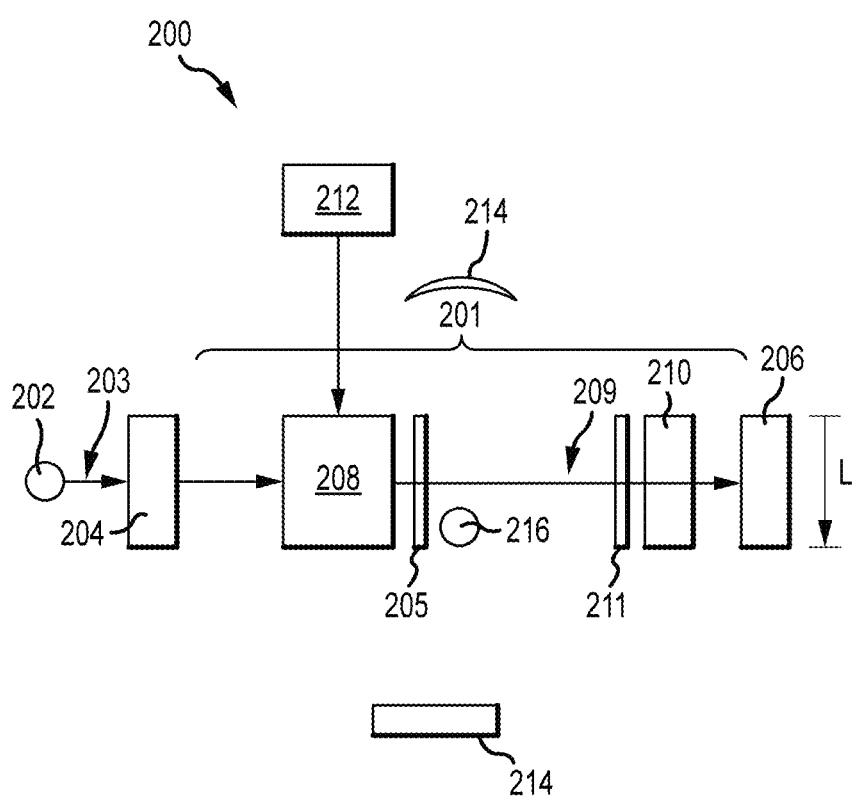
FIG. 2 illustrates an open cavity system including an open cavity between two retroreflectors as a transmitter and a receiver for amplification of acoustic signals in accordance with embodiments of the disclosure.

FIG. 2 is an open cavity system including an open cavity between a first retroreflector as a transmitter and a second retroreflector as a receiver for amplification of acoustic signals in accordance with embodiments of the disclosure. As shown in FIG. 2, an open cavity system 200 includes an open cavity 201 between a first retroreflector or a transmitter 204 and a second retroreflector or a receiver 206. The retroreflectors 204 and 206 can reflect signals back to their source with a minimum of scattering. The open cavity 201 is not completely enclosed by the first and second retroreflectors 204 and 206.

The open cavity system 200 also includes a first electroacoustic transducer 205 near a low frequency amplifier 208 for converting the low frequency electric signals from the transmitter 204 or amplifier 208 to acoustic signals. The open cavity system also includes a second electroacoustic transducer 211 near the power absorbing medium 210 for converting acoustic signals to low frequency electric signals before received by the receiver 206 or power absorbing medium 210.

In some embodiments, the transmitter 102 and receiver 104 may include the first and second retroreflectors 204 and 206 formed of a retroreflective metasurface, which may include individual structural elements less than half-wavelength. The retroreflective metasurface may include an array of unit cells that may be smaller than the wavelength or with a pitch smaller than the wavelength. The small unit cells allow the field distribution to be obtained correctly with a desirable resolution.

The open cavity system 200 can transfer acoustic signals from one end of open cavity 201 (e.g. transmitter) to an opposite end of the open cavity (e.g. receiver). In some embodiments, the acoustic signals are used to wirelessly transmit power. In some embodiments, the acoustic signals including the seed signal comprise low-frequency electric signals.

In some embodiments, the electroacoustic transducer is a piezoelectric transducer.

In some embodiments, the electroacoustic transducer is a dynamic loudspeaker.

In some embodiments, the electroacoustic transducer is a magnetostrictive transducer.

In some embodiments, the electroacoustic transducer is an electrostatic speaker.

In some embodiments, the electroacoustic transducer is a magnetostatic speaker.

In some embodiments, the electroacoustic transducer is an ionic conduction speaker.

In some embodiments, the electroacoustic transducer is a thermoacoustic speaker.

In some embodiments, the electroacoustic transducer is rotary speaker.

In some embodiments, the electroacoustic transducer is an air motion transformer.

In some embodiments, the electroacoustic transducer is a ferrofluidic transducer.

In some embodiments, the first and/or the second retroreflector may be formed of a retroreflective metamaterial.

In some embodiments, the first and/or the second retroreflector may be formed of an elastic material including a layer of artificially structured material with geometry to provide a retroreflective effect, such as volumetric distribution of elastic materials with differing elastic properties.

In some embodiments, the first retroreflector may include a first array of sub-wavelength retroreflective elements. In some embodiments, the second retroreflector may include a second array of sub-wavelength retroreflective elements.

In some embodiments, either or both of the first and second array of sub-wavelength retroreflective elements have an average center-to-center inter-element spacing equal to or less than half of the wavelength of the acoustic signals.

In some embodiments, either or both of the first and second array of sub-wavelength retroreflective elements have an average edge-to-edge inter-element spacing between two neighboring retroreflective elements equal to or less than half of the wavelength of the acoustic signals.

In some embodiments, each of the sub-wavelength retroreflective elements has an effective aperture area determined by the effective acoustic cross-section in excess of the physical area occupied by the respective element.

In some embodiments, the first retroreflector may include a retroreflective phase-conjugating metasurface.

In some embodiments, the second retroreflector may include a retroreflective phase-conjugating metasurface.

In some embodiments, the first and second retroreflectors have a two-dimensional (2D) surface and are substantially flat and uniform. Each of the first and second retroreflectors comprises a 2D metasurface comprising patterned structure with a sub-wavelength thickness.

In some embodiments, at least one of the first and second arrays of sub-wavelength retroreflective elements is a substantially flat 2D array.

In some embodiments, the open cavity system 200 may include partial walls or side retroreflectors. The open cavity system including the transmitter and the receiver may include a reflective medium. The reflective medium partially bounds the open cavity between the transmitter and the receiver and acts at least partially as a waveguide that assists wave propagation between the transmitter and the receiver. The reflective medium may include a regulator reflector and/or one or more side retroreflectors along a path of the beam from the transmitter to the receiver that may be configured to direct the signal toward the receiver.

Referring to FIG. 2 again, the open cavity system 200 may optionally include a reflective medium 214, such as one or more side retroreflectors, a generic reflector, or a solid material, placed along the path to help with directing the signals from the transmitter to the receiver. In some embodiments, when the two retroreflectors 204 and 206 are designed to be focused on each other, side retroreflectors may not be necessary.

In some embodiments, the reflective medium includes a wall.

In some embodiments, the reflective medium includes a line of trees.

In some embodiments, communication signals may be sent to a drone (receiver) beyond the line of sight along densely forested, winding roads by using automatic beamforming.

In some embodiments, the reflective medium at least partially bounds the open cavity between the transmitter and the receiver and acts at least partially as a waveguide that assists wave transmission between the transmitter and the receiver. The path from the transmitter to the receiver includes non-free space propagation channels, and is referred to a multipath.

In some embodiments, the spatial localization of the signals in the open cavity comprises a single beam.

In some embodiments, the spatial localization of the signals in the open cavity comprises multiple beams. For instance, the open cavity system may include one receiver receives signals from two or more transmitters.

In some embodiments, the spatial localization of the signals in the open cavity comprises a multipath beam.

In some embodiments, the spatial localization of the signals in the open cavity comprises an interference pattern with a power density hotspot at the receiver.

In some embodiments, the spatial localization of the signals in the open cavity comprises a focused beam with a focus in the vicinity of the receiver.

In some embodiments, the spatial localization of the signals in the open cavity comprises a focused beam with a focus in the vicinity of the transmitter.

In some embodiments, the spatial localization of the signals in the open cavity comprises a focused beam with a focus in the middle of the open cavity.

In some embodiments, the receiver 206 is at a distance less than a Fraunhofer distance from the transmitter 204.

In some embodiments, the Fraunhofer distance for a round aperture is $2D^2/\lambda$, where D is the diameter of the aperture. This distance is used to determine the far field range of the aperture. When referring to a pair of transmit and receive apertures of different diameters, the smaller value of a first diameter of the transmitter and a second diameter of the receiver is to be used to determine whether the two apertures are in the far field of each other.

In some embodiments, the receiver 206 is passive and configured to receive an automatically formed beam based upon the amplified acoustic signals.

In some embodiments, the acoustic signals have a wavelength ranging from 1 mm to 1 m.

In some embodiments, the acoustic signals have a frequency ranging from 20 Hz to 20 kHz. Higher frequency acoustic signals are more directional while lower frequency acoustic signals are less directional. The center frequency of the transmitter may be selected from its operational range to maximize the transmission of acoustic signals between the transmitter and the receiver.

The ratio of the cross-dimension of the transmitter and receiver to the wavelength of the acoustic signal is much smaller than that for optical devices. For optical devices, the transmitter is huge compared to the optical wavelength. For example, the optical cavities can be centimeters wide, and meters or hundreds of meters long such that the optical device is millions of wavelengths of the optical signal. In contrast, for the acoustic devices, the transmitter is comparable to the wavelength. For example, for the acoustic signals with a wavelength from 10 cm to 1 mm, the transmitter can be sized in millimeter or centimeter.

In some embodiments, each of the first and the second retroreflectors has a diameter less than 100 times the wavelength of the acoustic signals. In some embodiments, each of the first and the second retroreflectors has a diameter less than 50 times the wavelength of the acoustic signals.

In some embodiments, each of the first and the second retroreflectors has a diameter less than 10 times the wavelength of the acoustic signals.

The acoustic signals may travel in water. For example, when the frequency is less than 1 kHz, the acoustic signals may travel about 1000 km in the water without attenuation. However, the radio frequency (RF) signals are absorbed mostly in water such that the RF signals can travel less than 1 m when the frequency is 1 MHz.

In some embodiments, the acoustic signals are used to wirelessly transmit acoustic power.

In some embodiments, the acoustic signals are used to wirelessly transmit coded information.

In some embodiments, the acoustic signals are used to sense the properties of the propagation channel inside the open cavity.

In some embodiments, the acoustic signals are used to remotely image at least a portion of the open cavity.

Low Frequency Amplifier and Power Absorbing Layer

Referring to FIG. 2 again, the open cavity system 200 may also include an amplifier 208 that can amplify an seed signal from a signal generator 202. The amplifier 208 may be formed of an amplifying metamaterial that includes a sub-wavelength array of non-linear amplifying elements.

In some embodiments, the low frequency amplifier 208 may be a compound amplifier including a phase-preserving amplifier for amplifying the low frequency seed signals from the signal generator 202 to form amplified low frequency electric signals.

In some embodiments, the transmitter 204 may be integrated with the phase-preserving amplifier 208. In some embodiments, the low frequency amplifier 208 may be inside the open cavity and close to the transmitting metasurface or transmitter 204.

In some embodiments, the phase-preserving amplifier may include a metamaterial for amplifying the amplitude of the seed signal 203 to form an amplified signal 209 that is transmitted to a matched receiver.

In some embodiments, the phase-preserving amplifier may include a distributed amplification layer inside or adjacent to the first and the second retroreflectors.

In some embodiments, the distributed amplification layer includes an active metamaterial.

In some embodiments, the distributed amplification layer includes an array of sub-wavelength amplifying elements.

In some embodiments, the open cavity system may include an array of transducers such that each of the sub-wavelength amplifying elements has an electroacoustic transducer for converting acoustic signals to low-frequency electric signals and vice versa.

In some embodiments, the sub-wavelength amplifying elements may include transistors.

In some embodiments, the sub-wavelength amplifying elements comprise packaged amplifier modules.

In some embodiments, the distributed amplification layer is near the transmitter.

In some embodiments, the distributed amplification layer is structurally integrated with the transmitter.

In some embodiments, the distributed amplification layer is structurally integrated with the first array of sub-wavelength retroreflective elements.

In some embodiments, the distributed amplification layer is structurally integrated with the first array of sub-wavelength retroreflective elements comprising an active retroreflective metamaterial for controlling gain.

In some embodiments, each of the sub-wavelength retroreflective elements of the first array is structurally integrated with an amplification element.

In some embodiments, the receiver 206 comprises a power absorbing layer 210.

In some embodiments, the power absorbing layer is adjacent to the second retroreflector.

In some embodiments, the power absorbing layer is structurally integrated with the second retroreflector.

Resonator with a High Q-Factor

There may be an acoustic mode that has a high enough Q-factor to give sufficient gain for amplifying a seed signal. The mode allows the acoustic field to be pumped to a saturation point, which is defined by the saturation of the amplifier which provides the gain.

Referring to FIG. 2 again, the open cavity system 200 may also include adaptive gain controller 212 coupled to the low frequency amplifier 208. The open cavity system 200 may also include a power sensor 216 for monitoring the power from the amplifier 208. The adaptive gain controller 212 allows the gain to be monitored and dynamically changed to improve the maximum transfer of the open cavity system. For example, the gain may dynamically increase or decrease based on a power estimate from a power sensor 216 adjacent to or integrated with the amplifier 208.

In some embodiments, the amplifier 208 is tunable and configured to produce a plurality of fixed gain curves that facilitate automatic mode locking. In some embodiments, the open cavity system 200 may include a gain curve controller to dynamically select one of the pre-designed or fixed gain curves that the amplifier 208 is configured to provide. The plurality of pre-designed or fixed gain curves may have an amplification ratio as a function of incident power. The pre-designed curves may not be flat. The pre-designed gain curves may have a saturation point above which the gain starts to drop. Also, the pre-designed gain curves facilitate mode locking. The amplifier 208 can be designed, such that the gain drops as a function of the power and the gain does not continue to amplify at the same ratio.

The open cavity system 200 acts like a laser system, but does not require all the sidewalls as a normal laser cavity does. The open cavity system 200 can select the best mode that has the highest Q-factor. The acoustic seed signal 203 from the signal generator 202 can resonate in the open cavity system 200, such that the acoustic field becomes self-confined. For example, the open cavity 201 between the transmitter 204 and the receiver 206 allows the best mode with the highest Q-factor to be selected from a very large set of modes. In the best mode, the acoustic signal converted from the seed signal 203 can grow to saturation and all the other modes will die down or vanish. Locking occurs automatically with the pre-designed gain curves.

The transmitter of the open cavity system may randomly shoot beams in various directions toward the receiver. In some embodiments, some signal or energy may be lost in the transmission between transmitter and receiver.

The transmission of signals between the transmitter and the receiver is enhanced by multiple reverberations of signals in the open cavity, which causes an increase in the power flux density inside the open cavity.

The open cavity system includes an open cavity between the first and the second retroreflectors and the phase-preserving distributed amplification layer, and is a resonator. In some embodiments, the open cavity system has a Q-factor of at least 10. In some embodiments, the open cavity system has a Q-factor of at least 20. In some embodiments, the open cavity system has a Q-factor of at least 30. In some embodiments, the open cavity system has a Q-factor of at least 40. In some embodiments, the open cavity system has a Q-factor of at least 50.

In some embodiments, the open cavity includes multipath environments, such as forested roads and urban jungles, which block the signal propagation from the transmitter to the receiver.

In some embodiments, the open cavity includes a reflective medium, such as one retroreflector and/or a regular reflector, as a waveguide to assist signal propagation from the transmitter to the receiver.

In some variations, the reflective medium has a reflectivity of at least 10 percent. In some variations, the reflective medium has a reflectivity of at least 20 percent. In some variations, the reflective medium has a reflectivity of at least 30 percent. In some variations, the reflective medium has a reflectivity of at least 40 percent. In some variations, the reflective medium has a reflectivity of at least 50 percent. In some variations, the reflective medium has a reflectivity of at least 60 percent. In some variations, the reflective medium has a reflectivity of at least 70 percent. In some variations, the reflective medium has a reflectivity of at least 80 percent. In some variations, the reflective medium has a reflectivity of at least 90 percent. In some variations, the reflective medium has a reflectivity of at least 95 percent.

Time Reversal Beamforming

In some embodiments, the transmitter is configured to operate in a dual transmitting and receiving mode and to receive and transmit acoustic signals simultaneously to achieve time reversal beamforming.

Time reversal beamforming uses a signal from the location of the receiver that determines the phases to be applied to the radiating elements or the transmitter. The phases for the received signals at the transmitter can be determined based upon the location of the receiver and then phase-conjugating signals can be generated and transmitted. The phase-conjugation is a physical transformation of a wave field where the resulting field has a reversed propagation direction but keeps its amplitudes and phases.

A wide range of adaptive beamforming applications are contemplated and made possible using the beamforming techniques described herein. For example, in some embodiments, beamforming may include a multipath propagation channel involving one or more reflective, refractive, or generally scattering objects. A model of the multipath propagation channel can be simulated using any of a wide variety of simulation software packages, including, for example, ANSYS HFSS, COMSOL RF, CST MWS, etc.

In the open cavity system, a beam is formed passively on the receiving metasurface or receiver. The beamforming is achieved automatically using the phases of received signals. The beamforming of the open cavity system is done in a passive manner, such that the open cavity system does not require any complicated network for controlling each individual element of the transmitter and receiver, and also does not require any phase shifting element for each transducer element.

The open cavity system can have secure transmission of acoustic signals. The open cavity system does not require any digital phase shifting system, such that the open cavity system is low complexity and low cost.

The open cavity system is inherently safe. If something emerges in the propagation channel and prevents the signal transmission or energy transmission, the open cavity system would automatically shut off. In the open cavity system, the transmitter requires a properly matched receiver to operate.

In other words, the transmitter cannot operate without receiving good quality feedback from the matched receiver.

Movable Transmitter and Receiver

In some embodiments, the receiver and the transmitter are configured to be movable relative to each other or relative to a reference object. In some embodiments, the receiver and the transmitter are orientable relative to each other or relative to a reference object.

Figure 3:
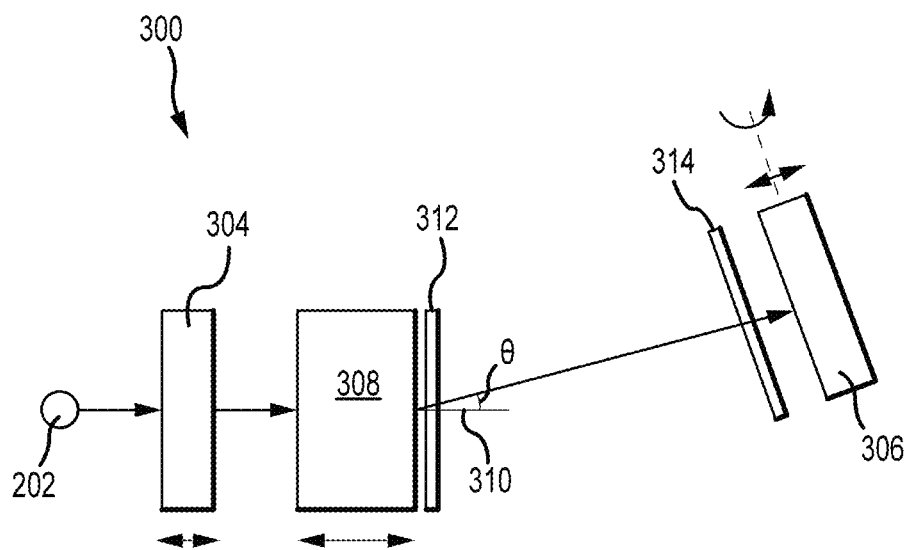
FIG. 3 illustrates an open cavity system including a movable retroreflector as transmitter and a movable retroreflector as receiver for amplification of acoustic signals in accordance with embodiments of the disclosure.

FIG. 3 illustrates an open cavity system including a movable transmitter 304 and a movable receiver 306 for amplification of acoustic signals in accordance with embodiments of the disclosure. An open cavity system 300 includes a signal generator for low frequency electric signals coupled to a transmitter 304 and an amplifier 308 for amplifying the low frequency electric signals transmitted from the transmitter 304. The open cavity system 300 also includes a first electroacoustic transducer 312 adjacent to the amplifier 308 for converting the low frequency electric signals to acoustic signals, and a second electroacoustic transducer for converting acoustic signals to low frequency electric signals which are then received by the receiver 306. As shown in FIG. 3, the receiver or second retroreflector 306 may be movable or rotatable such that the receiver or second retroreflector 306 can be oriented at an angle $\ominus$ from a central axis 310 that is perpendicular to the transmitter or the first retroreflector 304. Also, the transmitter 304 and amplifier 308 as well as electroacoustic transducers 312 and 314 may be configured to be movable. The receiver or second retroreflector 306 has an adjustable angle from with respect to the transmitter or first retroreflector.

As shown in FIG. 3, the disclosed open cavity system 300 may include two retroreflectors 304 and 306 that do not have to face each other, unlike the two mirrors in a conventional static closed cavity. The two retroreflectors of the open cavity system can be placed sufficiently far apart without losing high Q-factor, unlike the conventional static closed cavity or the laser system. In the conventional static closed cavity, such as a laser system, two mirrors face each other. When regular reflectors are placed sufficiently apart, the high Q-factor could be reduced or lost.

If the open cavity system 300 starts to lock on an undesirable mode, one may decrease the gain or may re-orient the retroreflector 306.

In some embodiments, the receiver or the second retroreflector is freely movable or rotatable.

In some embodiments, the receiver or the second retroreflector is fixed in position.

In some embodiments, the transmitter or the first retroreflector is freely movable or rotatable.

In some embodiments, the transmitter or the first retroreflector is fixed in position.

In some embodiments, the open cavity between the transmitter and the receiver contains a region containing air and a region filled with a liquid material. The acoustic signals pass through the liquid filled region between the transmitter and the receiver.

Figure 4:
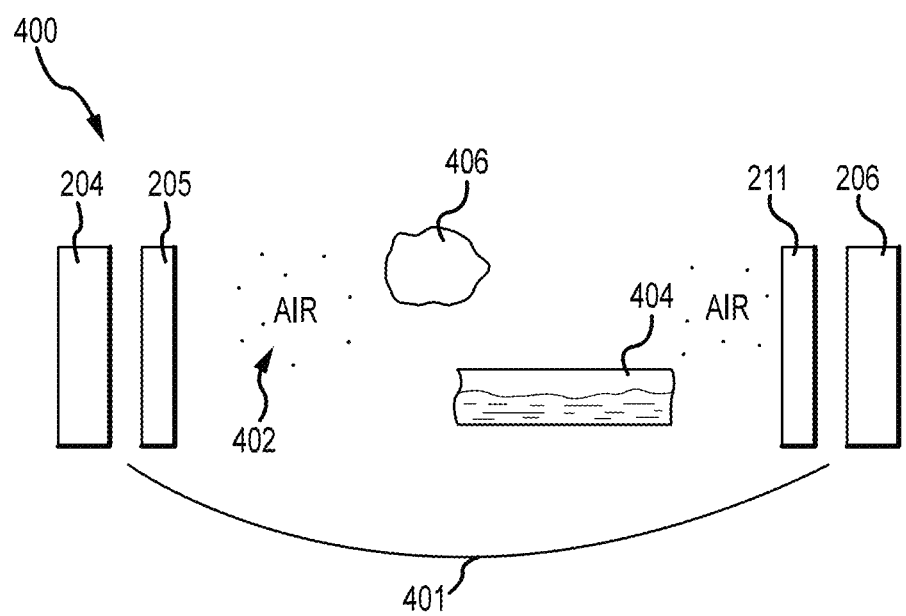
FIG. 4 illustrates an open cavity system including multipath non-free space propagation channels in accordance with embodiments of the disclosure.

FIG. 4 illustrates an open cavity system including multipath non-free space propagation channels in accordance with embodiments of the disclosure. As shown in FIG. 4, an open cavity system 400 includes a transmitter 204 and a first electroacoustic transducer 205 adjacent to transmitter 204 for converting low frequency electric signals to acoustic signals. The open cavity system 400 also includes a receiver 206 and a second electroacoustic transducer 211 for converting acoustic signals to low frequency electric signals. The open cavity system 400 also includes an open cavity 401 between the first and second electroacoustic transducers 205 and 211. The open cavity 401 may include water filled region 404, such as a tunnel or a cave. The acoustic signals from the first electroacoustic transducer 205 pass through the water-filled region 404 to the second electroacoustic transducer 211 and then receiver 206. The open cavity 401 may also include a solid material 406 that reflects the acoustic signals.

The multipath non-free space propagation channel may include air, water, and solid material. The open cavity system may also include side retroreflectors and side reflectors as illustrated in FIG. 2.

In some embodiments, the open cavity between the transmitter and the receiver comprises an air-filled cavity.

In some embodiments, the air-filled cavity comprises an air-filled tunnel.

In some embodiments, the open cavity between the transmitter and the receiver comprises a water-filled cavity.

In some embodiments, the water-filled cavity comprises a water-filled or underwater cave.

In some embodiments, the water-filled cavity comprises a water-filled or underwater tunnel.

In some embodiments, the open cavity between the transmitter and the receiver comprises at least one region filled with a gas and at least one region filled with a liquid.

In some embodiments, the open cavity between the transmitter and the receiver is at least partially bounded by a solid material.

In some embodiments, the solid material at least partially bounds the open cavity between the transmitter and the receiver and acts at least partially as a waveguide that assists wave propagation between the transmitter and the receiver.

Power Combiner

In some embodiments, the sub-wavelength amplifying elements may include a power combiner configured to combine the seed signal with an incoming signal returning from the opposite end of the open cavity, before amplifying the combined signal.

Figure 5:
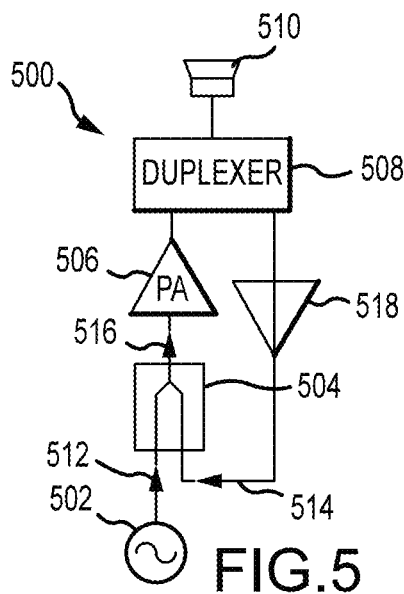
FIG. 5 is an equivalent circuit diagram of an open cavity system including one unit cell in accordance with embodiments of the disclosure.

FIG. 5 is an equivalent circuit diagram of an open cavity system including a unit cell in accordance with embodiments of the disclosure. As shown, an open cavity system 500 includes a signal generator 502 that provides a seed signal 512 to a power combiner 504, which is coupled to an amplifier 506. The seed signal is a low frequency electric signal. The power combiner 504 combines the seed signal 512 from the signal generator 502 with the electric signal amplified by the amplifier 506. The electric signal is converted from an acoustic signal by an electroacoustic transducer. The acoustic signal may travel through the multipath non-free space propagation channel.

When the open cavity system 500 is initially turned on, the seed signal 512 is not strong. The seed signal 512 is converted to an acoustic signal by an electroacoustic transducer. The acoustic signal has to propagate back and forth between an electroacoustic transducer 510 and a receiver (not shown in FIG. 5) multiple times, such that the seed signal 512 gets amplified through the amplifying metamaterial or amplifier 506. The amplitude of the seed signal 512 starts to increase in the open cavity and forms an amplified electric signal 514, which returns to the transmitter at one end of an open cavity from the receiver at the opposite end of the open cavity. The power combiner 504 combines the seed signal 512 with the amplified signal 514 to generate a combined signal 516. When the combined electric signal 516 outputted from the power combiner 504 reaches a saturation point and becomes locked on a mode, the seed signal 512 is very weak compared to the amplified signal such that the seed signal does not distort the phase of the combined signal 516 very much.

The open cavity system 500 also includes a duplexer 508 that allows bi-directional communication over a single path to the electroacoustic transducer 510 operated in the dual mode that allows the transmitter to transmit and receive signals simultaneously. The duplexer 508 is coupled to the power combiner 504. In some embodiments, the open cavity system 500 may optionally include a low noise amplifier (LNA) 518 coupled between the duplexer 508 and the power combiner 504. In some embodiments, the open cavity system may optionally include the power amplifier 506. In some embodiments, the open cavity system may include both the LNA 518 and the power amplifier 506.

Figure 6:
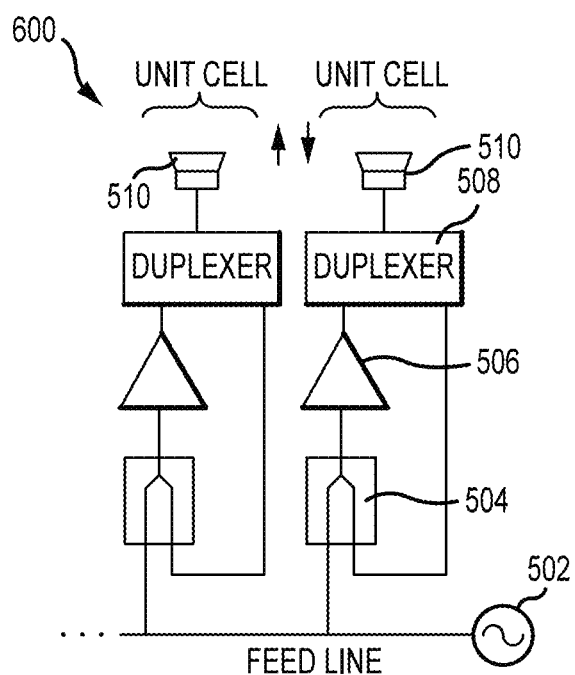
FIG. 6 is an equivalent circuit diagram of an open cavity system including two or more unit cells in accordance with embodiments of the disclosure.

FIG. 6 is an equivalent circuit diagram of an open cavity system including two or more unit cells in accordance with embodiments of the disclosure. As shown, an open cavity system 600 includes a signal generator 502 that provides a seed signal 512 to a first power combiner 504A, which is coupled to a first amplifier 506A. The open cavity system 600 also includes a first unit cell that includes a first duplexer 508A that allows bi-directional communication over a single path to a first electroacoustic transducer 510A.

The open cavity system 600 also includes a second unit cell that provides the seed signal 512 from the signal generator 502 to a second power combiner 504B, which is coupled to a second amplifier 506B. The open cavity system 600 also includes a second duplexer 508B that allows bi-directional communication over a single path to a second electroacoustic transducer 510B. The first power combiner 504A combines the seed signal 512 with the amplified signal 514A to produce a combined signal 516A. The second power combiner 504B combines the seed signal 512 with the amplified signal 514B to produce a combined signal 516B. It will be appreciated by those skilled in the art that the open cavity system may include more unit cells.

Circulator

The open cavity system may include a circulator and a pair of diodes in a dual mode including transmitting and receiving modes. The circulator allows time reversal beamforming in which signals can be simultaneously transmitted and received at the transmitter.

In some embodiments, the sub-wavelength amplifying elements may include a 3-port circulator configured to isolate incoming acoustic signals from outgoing amplified acoustic signals. The sub-wavelength amplifying elements may comprise diodes configured to isolate incoming acoustic signals from the outgoing amplified acoustic signals.

The 3-portcirculator is a nonlinear RF device, including three ports, Ports 1-3. Port 1 is an energy entry port that can flow to Port 2, but does not flow to Port 3. The energy entering through Port 3 can only flow into Port 1 and back to the transmitter. The signals received in Port 2 can be amplified and sent to Port 3.

Figure 7:
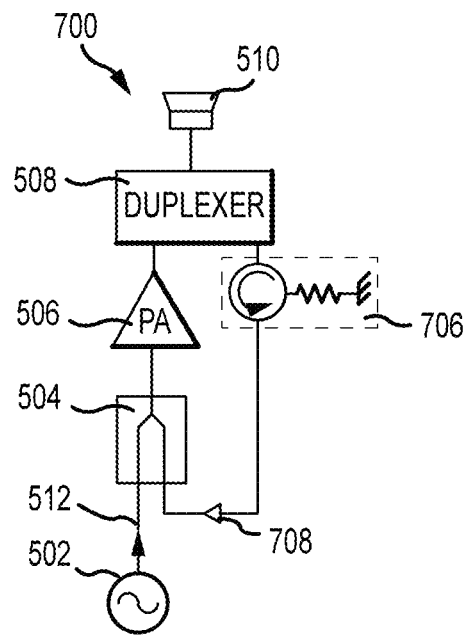
FIG. 7 is an equivalent circuit diagram of the open cavity system including the unit cell of FIG. 5 in addition to a polarizer filter and a circulator in accordance with embodiments of the disclosure.

FIG. 7 is an equivalent circuit diagram of the open cavity system of FIG. 5 including a unit cell in addition to a polarizer filter and a circulator in accordance with embodiments of the disclosure. As shown in FIG. 7, an open cavity system 700 may include a signal generator 502 that provides a seed signal 512 to a power combiner 504, which is coupled to an amplifier 506. The open cavity system 700 also includes a duplexer 508 that allows bi-directional communication over a single path to an electroacoustic transducer 510 in a dual mode for time reversal beamforming. The duplexer 508 is coupled to the amplifier 506.

The open cavity system 700 may optionally include an isolator 706. The duplexer 508 may be optionally coupled to the isolator or circulator 706. The amplified signal 708 received at the electroacoustic transducer 510 that may optionally go through the circulator 706, and then combined with the seed signal 512 in the power combiner 504. In some embodiments, the duplexer 508 is a circulator duplexer.

Reflective Boundary

In some embodiments, the open cavity may include partial obstructions between the transmitter and receiver, such as tree trunks or branches, or small buildings, among others.

In some embodiments, the reflective medium includes a metal.

In some embodiments, the reflective medium includes a fence.

In some embodiments, the open cavity between the transmitter and the receiver contains a reflective boundary or reflective surfaces, which may block all possible propagation paths between the transmitter and the receiver. It turns out that reverberation in the open cavity is very useful for enhancing transmission into regions that are shielded by the reflective boundary or reflective surfaces, for example, getting through a thin layer of a slightly conducting solid, such as soil or rock.

In some embodiments, the transmission of signals between the transmitter and the receiver is enhanced by multiple reverberations of signals in the open cavity, which causes an increase in the power flux density inside the open cavity.

Figure 8:
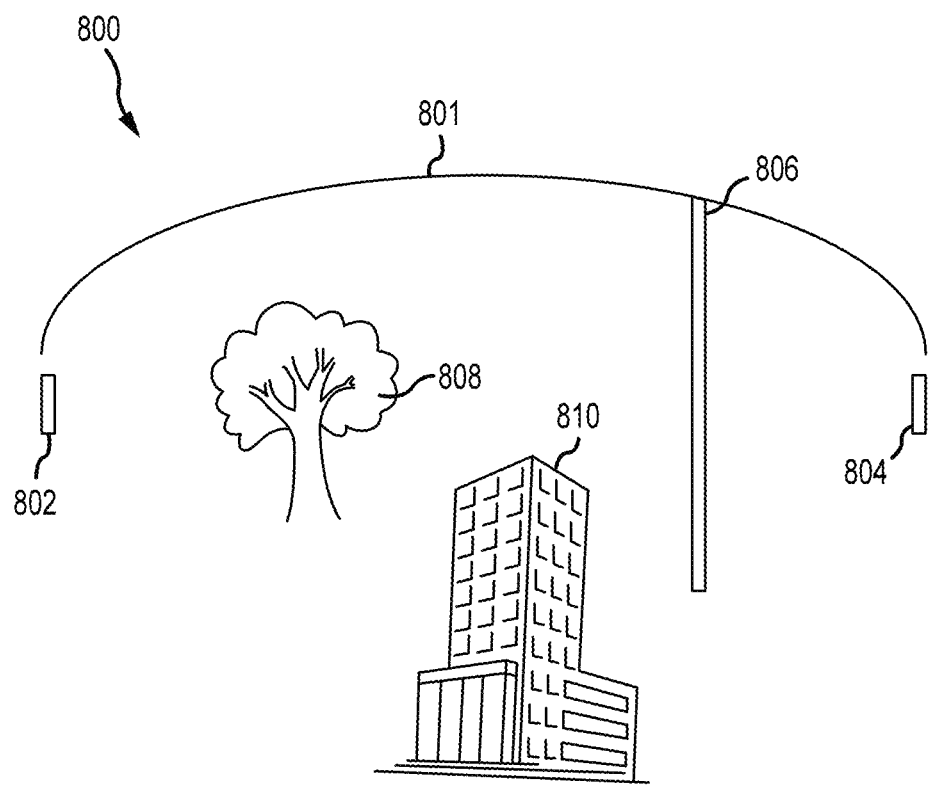
FIG. 8 depicts an open cavity system including a reflective boundary in an open cavity between a transmitter and a receiver in accordance with embodiments of the disclosure.

FIG. 8 illustrates a reflective boundary in the open cavity in accordance with embodiments of the disclosure. As shown, an open cavity system 800 includes a reflective boundary 806 between a transmitter 802 and a receiver 804. The reflective boundary 806 is reflective such that it blocks the signals from the transmitter 802. However, due to the high-Q factor, the signals from the transmitter can be transmitted to the receiver 804 from multiple reverberations of the signals in the presence of the reflective boundary.

As shown in FIG. 8, the open cavity system 800 may include a reflective medium, such as trees 808, small buildings 810, fences, or walls among others. The beam from the transmitter to the reflective medium or reflective boundary and then to the receiver is referred to a multipath beam.

In some variations, the reflective boundary has a reflectivity of at least 10 percent. In some variations, the reflective boundary has a reflectivity of at least 20 percent. In some variations, the reflective boundary has a reflectivity of at least 30 percent. In some variations, the reflective boundary has a reflectivity of at least 40 percent. In some variations, the reflective boundary has a reflectivity of at least 50 percent. In some variations, the reflective boundary has a reflectivity of at least 60 percent. In some variations, the reflective boundary has a reflectivity of at least 70 percent. In some variations, the reflective boundary has a reflectivity of at least 80 percent. In some variations, the reflective boundary has a reflectivity of at least 90 percent. In some variations, the reflective boundary has a reflectivity of at least 95 percent.

Diffractive Retroreflector

Embodiments of the diffractive retroreflector may be designed and implemented using numerical optimization approaches. Conventional concentrators (parabolic mirrors, etc.) have concentration factors at 10-30% of the theoretical maximum as described above, so there is much improvement to be made using non-imaging diffractive acoustics that are numerically optimized according to the design approaches described herein.

Figure 9:
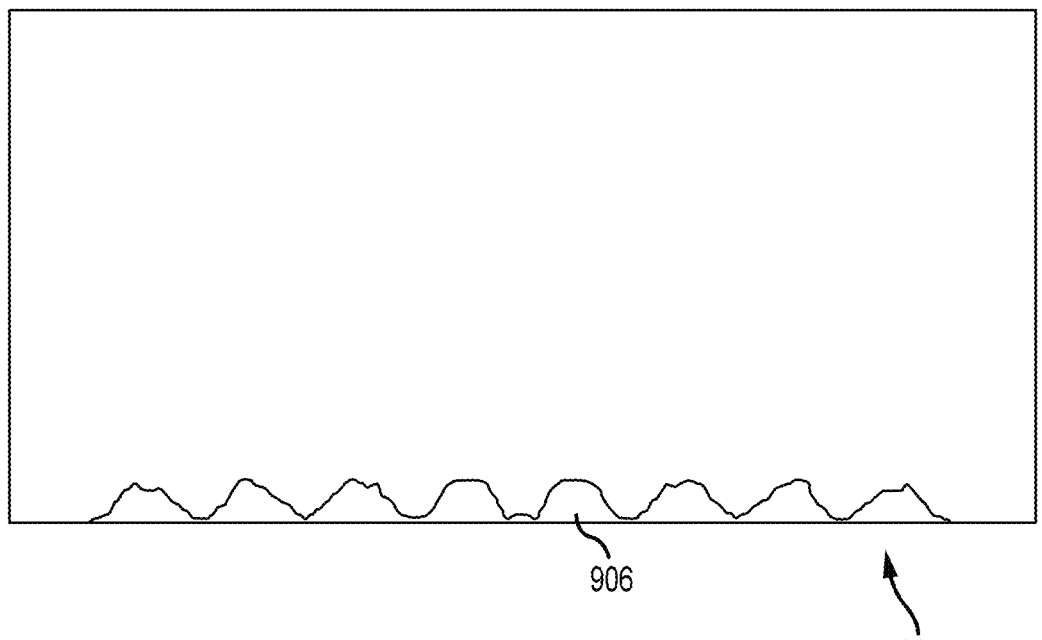
FIG. 9 depicts an example of an elastic diffractive retroreflector in accordance with embodiments of the disclosure.

In some embodiments, the diffractive retroreflector is an all-elastic structure, and numerical optimization techniques are used to determine the distribution of elastic material in the structure. FIG. 9 shows an example of a metasurface with an elevation profile of a material arranged (e.g. by 3D printing) on a surface, where the elevation profile can be optimized based on a cost function. An illustrative example is shown in FIG. 9, which shows an elastic diffractive retroreflector 902 with an elevation or thickness profile 906. In this example, the diffractive retroreflector 902 is implemented as an elastic layer of variable thickness, positioned on top of a ground plane.

The thickness profile 906 of the elastic diffractive retroreflector may be determined by a shape optimization algorithm, where the thickness profile 906 is treated as a set of independent control variables (corresponding to a sub-wavelength discretization of the thickness profile as a function of position on the aperture, e.g. discretization on a length scale less than or equal to about $\lambda/10$, $\lambda/5$, or $\lambda/3$); then, the algorithm uses a small perturbation to one of the control variables, and solves the forward wave propagation problem to determine the correspondingly small change in an optimization goal or cost function.

The algorithm thus proceeds by computing a gradient of the cost function (i.e. the sensitivity vector) and iterating with a standard Newton, damped Newton, conjugate-gradient, or other gradient-based nonlinear solver, optionally subject to a selected constraint on the maximum thickness. In some approaches, the sensitivity vector is obtained not by solving N forward wave propagation problems (for an N-ary discretization of the thickness profile), but instead by solving a single adjoint problem that produces the entire sensitivity vector. See, e.g., U.S. Patent Publication No. 2016/0261049 (hereinafter "Driscoll"), herein incorporated by reference.

The iterative optimization algorithm continues until termination tolerances or conditions are met. A termination condition can be imposed on some norm of the sensitivity vector (e.g., L1 or L2 norm), in which case the optimization algorithm is guaranteed to converge. Alternatively, the termination condition can be imposed as an inequality on the scalar value of the cost function; in this case, the algorithm may fail to meet the imposed condition. For this reason, the termination condition is usually applied to the sensitivity vector, and the final value of the optimization cost function is taken as an output of the algorithm rather than an input.

For applications that require the final value of the cost function to be below a certain tolerance, the optimization loop that failed to produce such an outcome can be repeated with a different initial guess. The above equations for the theoretical maximum performance of a retroreflector can inform an assessment of the achievable tolerance. One or more optimization loops can be run for one or more respective initial guesses; such loops are entirely independent and can be computed in parallel, using distributed computing. Initial guesses can include, for example, a periodic arrangement of material (a diffraction grating). A more accurate initial guess can be a thickness profile of a standard diffractive Fresnel lens that would bring a focus to the small adaptive aperture.

The cost function can be any function that indicates the quality of concentration obtained by the trial configuration for one or more acceptance angles of the retroreflector. For example, the cost function could be the aperture efficiency (i.e. the fraction of power incident on the large aperture that is received at the small aperture), averaged over a selected set of acceptance angles. In this example, the small aperture is scaled down by a factor of 4 with respect to the large aperture, corresponding to compression factor of 4 (in a 2D scenario) or 16 (in a 3D scenario), which yields a theoretical maximum acceptance angle of about 14°. The thickness profile 906 was obtained by optimizing the average aperture efficiency for radiation incident at incident at 0°, 3°, and 6°, and obtaining aperture efficiencies of 56%, 51%, and 31%, with full-wave simulations at these incidence angles.

The shape optimization yields a prescription for the thickness profile 906 that can be input into a fabrication process. An elastic layer of varying thickness can be readily fabricated by machining a flat slab of an elastic material (for example, using standard CNC technology), by casting a moldable material in the desired shape, or by 3D printing. In one approach, the 3D printing is done with a single-material 3D printer, with no material in the "valleys" of the thickness profile. In another approach, the 3D printing is done with a multi-material 3D printer that prints a first elastic material for voxels below the thickness profile and a second elastic material for voxels above the thickness profile, up to a preselected overall height for the structure (e.g. corresponding to the maximum thickness over the entire aperture).

It will be appreciated that a multi-material 3D printing process can be used to implement more complicated all-elastic structures, e.g. having voids or overhangs; thus, in some approaches, the numerical optimization approach may proceed by optimizing not merely for shape as above, but for binary (or k-ary, for k different materials) distribution of 3D printed materials within a prescribed volume for the diffractive retroreflector structure. For example, the control variables can be values of the elastic parameters for sub-wavelength voxels of the retroreflector, or parameters of smoothed step functions, the control variables then prescribing which material fills each voxel. See, e.g., Driscoll (cited above) (describing, inter alia, optimizing a dielectric metamaterial with smoothed Heaviside functions representing the binary aspect of the dielectric material distribution).

Modulating Retroreflector

In some embodiments, an apparatus for exchanging acoustic signals between a first terminal and a second terminal may include a first terminal comprising a first retroreflector having a first array of sub-wavelength retroreflective elements at one end of an open cavity for transmitting a seed signal in form of a beam directed toward the receiver and for receiving the signal returned from the second terminal. The apparatus may also include a second terminal comprising a second retroreflector having a second array of sub-wavelength retroreflective elements at an opposite end of the open cavity for returning the transmitted seed signal.

In some embodiments, the first and/or the second retroreflector may be formed of an elastic material including a layer of artificially structured material with geometry to provide a retroreflective effect, such as volumetric distribution of differential elastic materials.

In some embodiments, the second retroreflector is a modulating retroreflector.

In some embodiments, the receiver may act as a re-transmitter. The receiver is a modulating retroreflector. The modality of the modulating retroreflector enables information transfer from a low-power mobile terminal (e.g. a receiver) to a high-power station (e.g. a transmitter). The receiver retransmits signals modulated by the modulating retroreflector back to the transmitter.

In some embodiments, the modulating retroreflector comprises a modulating array of sub-wavelength elements, wherein the sub-wavelength elements comprise volumetric distributions of at least one material configured to achieve retroreflective behavior for a range of incidence angles.

In some embodiments, the modulating array of sub-wavelength elements modulates the intensity of the reflected wave.

In some embodiments, the modulating array of sub-wavelength elements modulates the phase of the reflected wave.

In some embodiments, the modulating array of sub-wavelength elements achieves modulation by an electromechanical actuation of a partition of the array. For example, one layer can move relative to the substrate, or relative to another layer.

In some embodiments, the modulating array of sub-wavelength elements achieves modulation by an electrical stimulation of an electroactive material layer spanning the array. The electroactive material comprises a material selected from a group consisting of a semiconductor material, a liquid crystal material, an electroactive polymer, a piezoelectric material, a ferroelectric material, a magnetostrictive material, an electrorheological fluid, a stimuli-responsive gel, and a tunable metamaterial.

In some embodiments, the first retroreflector is a modulating retroreflector.

In some embodiments, an apparatus is provided for receiving acoustic signals from a transmitter, the apparatus comprising a receiver comprising a retroreflector having an array of sub-wavelength retroreflective metasurface elements at a moving end of an open resonator for receiving acoustic signals from a matched transmitter at an opposite end of the open resonator, wherein the receiver is configured to form a beam from the acoustic signals transmitted from the matched transmitter.

In some embodiments, the retroreflector comprises an array of sub-wavelength elements, wherein the sub-wavelength elements comprise volumetric distributions of at least one material configured to achieve retroreflective behavior for a range of incidence angles.

In some embodiments, the at least one material of the volumetric distributions comprises a refractive (partially transparent) material.

In some embodiments, the at least one material of the volumetric distributions comprises a partially reflective material.

In some embodiments, the volumetric distributions comprise at least one patterned layer that is patterned in one or two dimensions.

In some embodiments, the volumetric distributions are created by free-form manufacturing, additive manufacturing, or 3D-printing. The additive manufacturing is one or more of stereolithography, microlithography, nanolithography, fused deposition modeling, selective laser sintering, direct metal laser sintering, physical vapor deposition, chemical vapor deposition, and nanodeposition.

In some embodiments, the volumetric distributions are created by subtractive manufacturing (machining). In some aspects, the subtractive manufacturing is one or more of mechanical (traditional) machining processes, including turning, boring, drilling, milling, broaching, sawing, shaping, planing (shaping), reaming, tapping, or water jet machining. In some aspects, the subtractive manufacturing is one or more of electrical discharge machining, electrochemical machining, electron beam machining, ion beam machining, laser beam machining, laser ablation, photochemical machining, etching, and ultrasonic machining.

In some embodiments, the array of sub-wavelength elements is situated on a substrate. The substrate is partially reflective.

In some embodiments, a method is provided for designing a retroreflector comprising an array of sub-wavelength elements. The sub-wavelength elements contain volumetric distributions of at least one refractive material, wherein the volumetric distributions are calculated using a numerical algorithm.

In some embodiments, the numerical algorithm includes a forward model and an inverse problem solver.

In some embodiments, the forward model is a numerical simulation of a trial design of the retroreflector.

In some embodiments, the inverse problem solver is a nonlinear problem solver.

In some embodiments, the inverse problem solver is an optimization problem solver.

For simulation, the design process includes applying a number of illumination patterns such as incident plane waves in a number of directions, followed by maximizing a certain figure of merit, such as the backscattering cross-section (a.k.a. monostatic radar cross-section) of the metasurface.

In some embodiments, the optimization problem solver uses an optimization cost function formulated in terms of a figure of merit of the retroreflector.

In some embodiments, the figure of merit of the retroreflector is the backscattering cross-section of the retroreflector.

In some embodiments, the figure of merit of a retroreflector is the monostatic radar cross-section of the retroreflector.

In some embodiments, the forward model comprises a numerical model of a trial design of a retroreflector illuminated by a plane wave with a specified wave vector from a range of wave vectors.

In some embodiments, the range of wave vectors includes wave vectors corresponding to different orientations of the plane wave relative to the retroreflector.

In some embodiments, the range of wave vectors includes wave vectors corresponding to different frequencies of the plane wave.

In some embodiments, the inverse problem solver is based at least in part on the transformation acoustics design method.

In some embodiments, the volumetric distributions of the at least one material correspond to a volumetric Gradient Index of Refraction (GRIN) lens. The GRIN lens is a refractive lens with an inhomogeneous distribution of refractive indexes.

In some embodiments, the volumetric distributions corresponding to a volumetric (GRIN) lens are calculated at least in part using the transformation acoustics design method.

In some embodiments, the volumetric distributions corresponding to a volumetric (GRIN) lens are calculated at least in part using the transformation acoustics design method, and a known solution for a volumetric (GRIN) lens of a different shape. Transformation acoustics is a technique that allows one to begin with a known design of a wave-manipulating device, such as a Maxwell-Luneburg lens (or any other lens or device), and transform the shape of the device (at the design stage) by replacing the volumetric content of the device with a metamaterial distribution whose properties are calculated using transformation acoustics theory.

EXAMPLES

In some embodiments, an acoustic amplifier may be added either adjacent to the retroreflective boundary or integrated with the retroreflective boundary. The acoustic amplifier or amplifying metamaterial may be modeled by an imaginary part of the refracted wave and may correspond to amplification.

The acoustic signals are spatially modulated (beamformed) signals that may be defined by any desired radiation patterns. The term "beam" in this application refers to any two- or three-dimensional spatial localization of power distribution, including but not limited to pencil beams, focused beams, multipath beams and their combinations. The images shown in FIGS. 10A-D present visual propagation of acoustic waves in the open cavity between a first retroreflector and a second retroreflector. The propagation of the acoustic wave is simulated using Helmholtz equation. In FIGS. 10A-D, a thin vertical rectangle on the left represents a transmitter or the first retroreflector, and a symmetrically-placed rectangle on the right corresponds to a receiver or the second retroreflector.

Figure 10A:
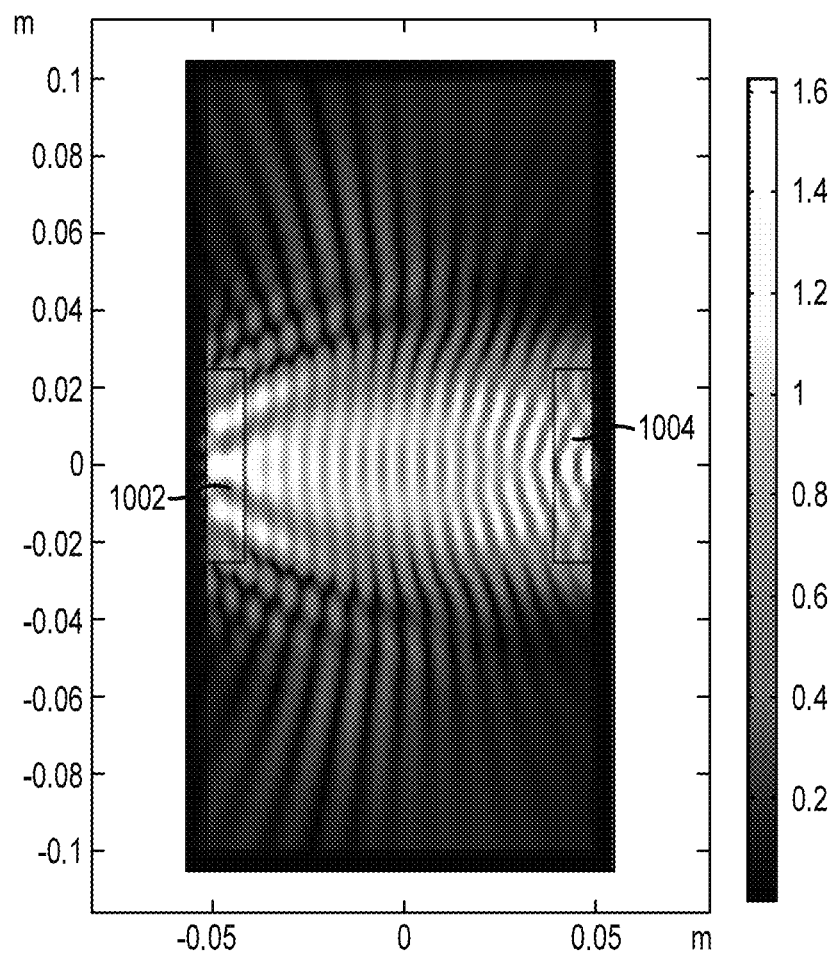
FIG. 10A illustrates an image of energy density distribution (proportional to the acoustic wave intensity) for an open cavity formed by a first retroreflector and a second retroreflector with a gain parameter of 0.01 and an attenuation parameter of 0.01 in accordance with embodiments of the disclosure.

FIG. 10A illustrates a section of the energy density distribution (proportional to the acoustic wave intensity) for an open cavity formed by a first retroreflector and a second retroreflector. The transmitter and receiver are of equal size (e.g. diameter), for example, 5 wavelengths at the operational frequency and spaced 10 wavelengths apart, which is twice the size or diameter of the transmitter and receiver. This numerical simulation serves to illustrate the concept of automatic beamforming in an open cavity formed by two retroreflectors. The transmitter includes a retroreflective metasurface (a vertical boundary to the left of a rectangular region 1002), which is modeled as a phase-conjugating boundary, and an amplifying (gain) region 1002 shown as the rectangular region. Similarly, the receiver includes a retroreflective metasurface modeled as a phase-conjugating boundary (a vertical boundary to the right of a rectangular region 1004), and an absorbing (power-receiving) region 1004 in front of the retroreflective metasurface. The amplifying and absorbing regions 1002 and 1004 are both 1 wavelength thick. The gain parameter used in this simulation is 0.01. The absorption parameter is 0.01. The open cavity between the transmitter and receiver comprises free space.

Figure 10B:
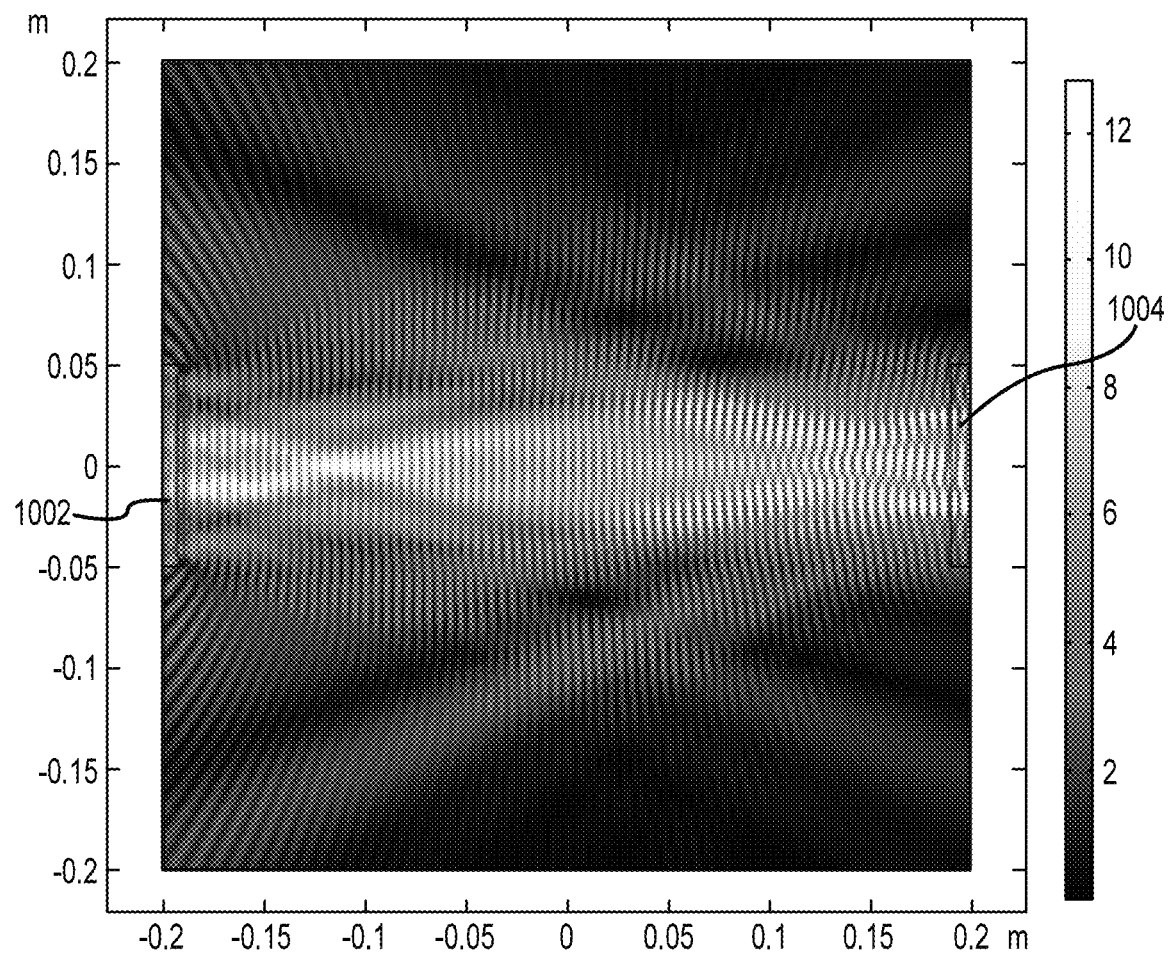
FIG. 10B illustrates an image of energy density distribution (proportional to the acoustic wave intensity) for an open cavity formed by a first retroreflector and a second retroreflector with a gain parameter of 0.03 and an attenuation parameter of 0.01 in accordance with embodiments of the disclosure.

FIG. 10B illustrates the same system as described in FIG. 10A, but operating with a gain parameter of 0.03.

Figure 10C:
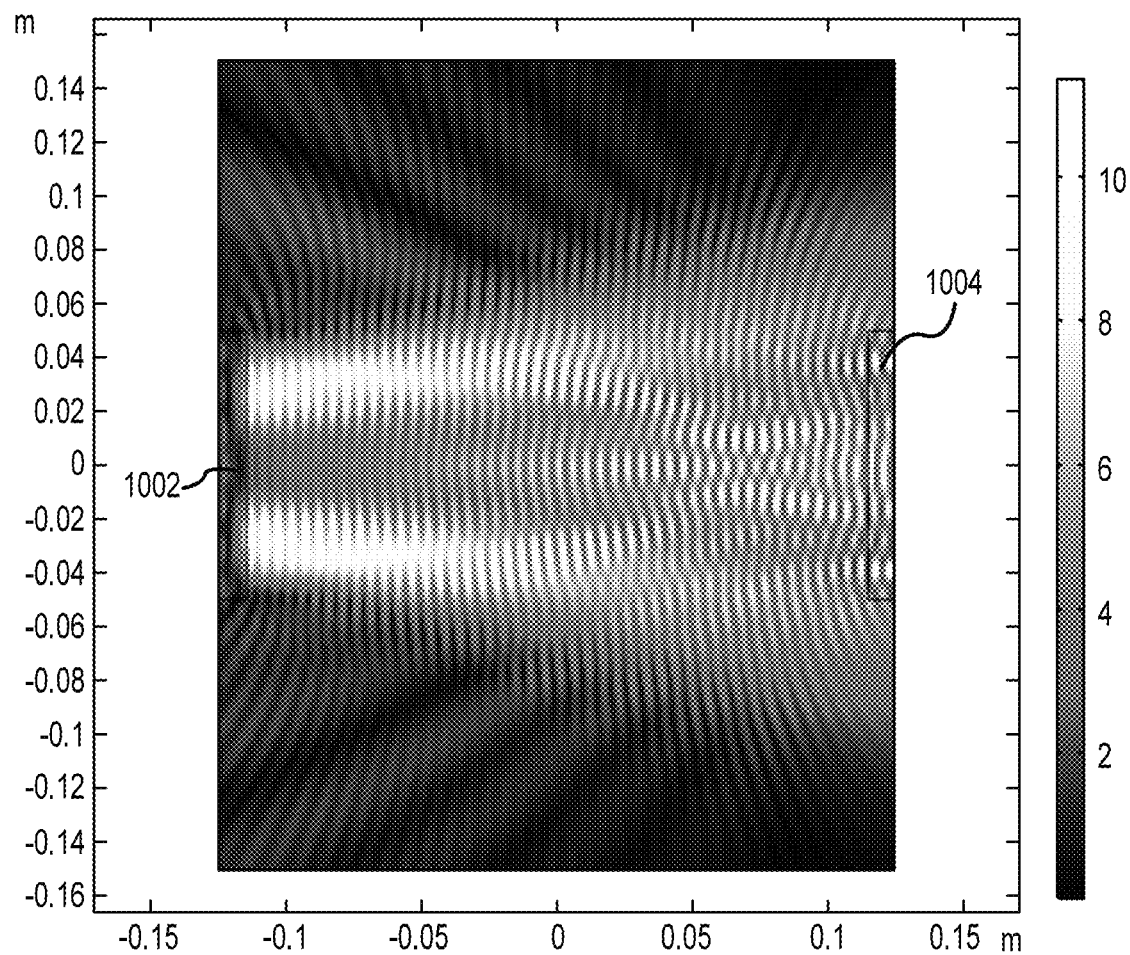
FIG. 10C illustrates an image of the energy density distribution (proportional to the acoustic wave intensity) for an open cavity formed by a first retroreflector and a second retroreflector with a gain parameter of 0.228 and an attenuation parameter of 0.01 in accordance with embodiments of the disclosure.

FIG. 10C illustrates a system similar in structure to the system depicted in FIG. 10A, but having a larger-diameter (10 wavelength) transmitter and receiver and a longer transmission distance (40 wavelengths or 4 diameters of the transmitter). The gain parameter of the amplifying layer at the transmitter is 0.228. The attenuation parameter of the absorbing layer at the receiver is 0.01.

Figure 10D:
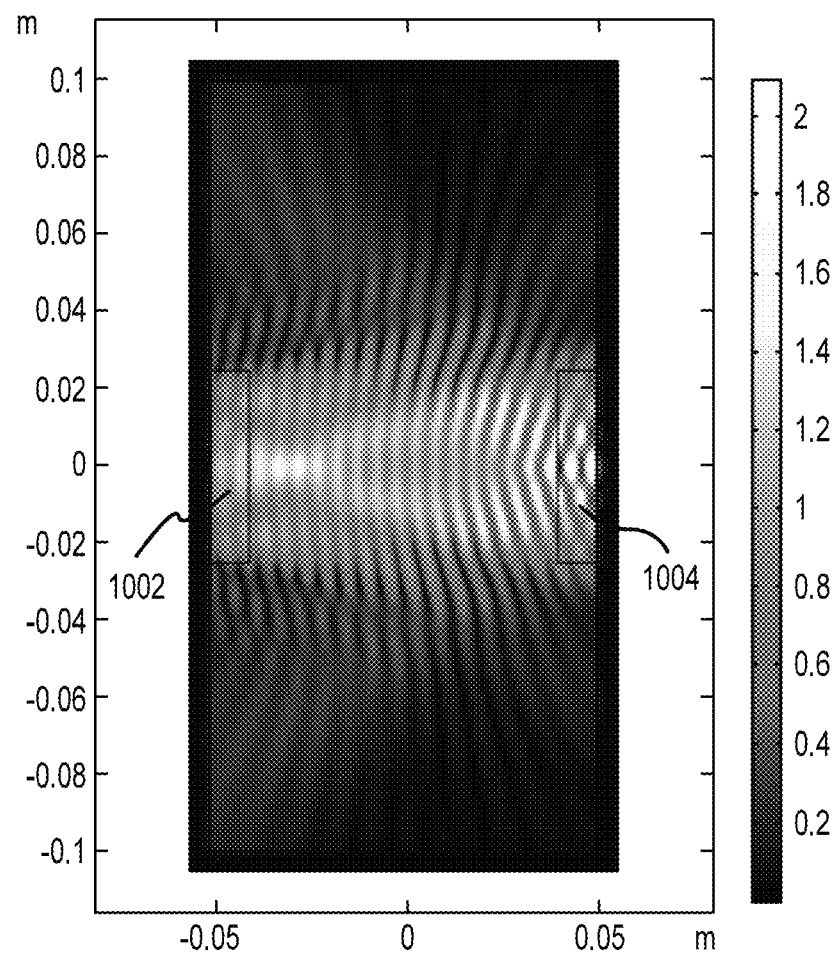
FIG. 10D illustrates an image of the energy density distribution (proportional to the acoustic wave intensity) for an open cavity formed by a first retroreflector and a second retroreflector with a gain parameter of 0.4625 and an attenuation parameter of 0.01 in accordance with embodiments of the disclosure.

FIG. 10D illustrates the same system as described in FIG. 10C, but operating with a gain parameter of 0.4625.

Figure 11:
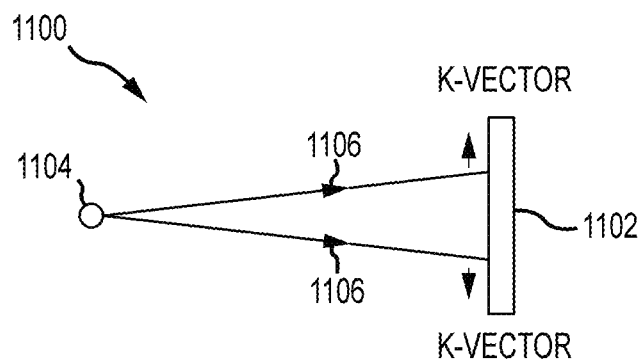
FIG. 11 illustrates a point source with a retroreflective boundary in accordance with embodiments of the disclosure.

FIG. 11 illustrates a retroreflective boundary that acts as a passive beamformer in accordance with embodiments of the disclosure. As shown, a system 1100 includes a retroreflective boundary 1102 or retroreflector on the right side of a point source 1104. All the other boundaries are open, such that radiation can go through all the other sides except the retroreflective boundary on the right side. As shown, incident signal 1106 radiates from the point source 1104 and the retroreflector reflects the signal 1108 back to the point source 1104 by the retroreflective boundary.

In some embodiments, the retroreflector is not curved and has a flat surface. The retroreflector is entirely flat and uniform. In some embodiments, the retroreflector includes a 2D retroreflective metasurface including a thin layer of metamaterial. The metamaterial includes an array of unit cells or metasurface elements.

Figure 12:
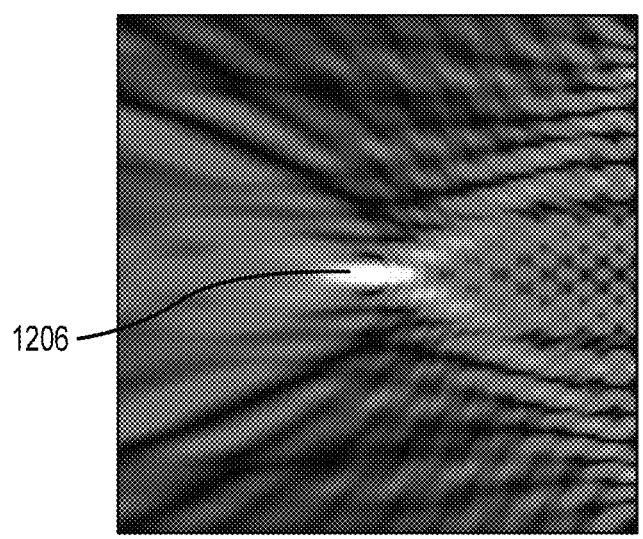
FIG. 12 illustrates an image of energy density distribution created by the retroreflective boundary of FIG. 11 in accordance with embodiments of the disclosure.

FIG. 12 illustrates a concept of beamforming using a retroreflective metasurface. The distribution in the image represents the acoustic wave energy density obtained from a simulation modeling the retroreflector as a phase-conjugating boundary. The simulation uses a point source 1104 (in the center of the frame) as a source of radiation. As shown in FIG. 12, the fraction of the radiation pointing toward and hitting the retroreflective boundary 1102 gets retroreflected back toward the point source 1104, and forms a clear focused beam-like energy distribution. A saddle point (and peak of energy density) 1206 of the beam is shown to be nearly co-located with the point source 1104, which indicates that the beamforming is automatic by the retroreflective boundary 1102. All of the acoustic energy that hit the retroreflective boundary 1102 goes back toward the point source 1104 from the retroreflective boundary 1102, which acts as a beamforming aperture.

In the simulation, the retroreflective boundary 1102 flips a positive K-vector and changes the positive K-vector to a negative K-vector. The retroreflector is different from a regular reflector. For example, the regular reflector flips only the normal components of the K-vector parallel to the surface of the K-vector, while the components of the K-vector parallel to the surface of the regular reflector are conserved. However, the retroreflective boundary 1102 changes the K-vector dramatically different from a regular reflector. Specifically, the retroreflective boundary 1102 changes the sign of the K-vector components that are parallel to and normal to the surface of the retroreflective boundary 1102, such that the entire K-vector reverses its direction as a result of reflection from the retroreflective boundary 1102.

In the frequency domain, retroreflection is equivalent to time reversal, provided that it is applied to every Fourier (plane wave) component of the incident field. Also, the phase of the plane wave (also known as its eikonal) equals to K-vector multiplied by propagation path length. In some embodiments, the retroreflective metasurface may be implemented as a phase conjugating metasurface. Conjugating the plane wave is the same as flipping the K-vector.

Figure 13:
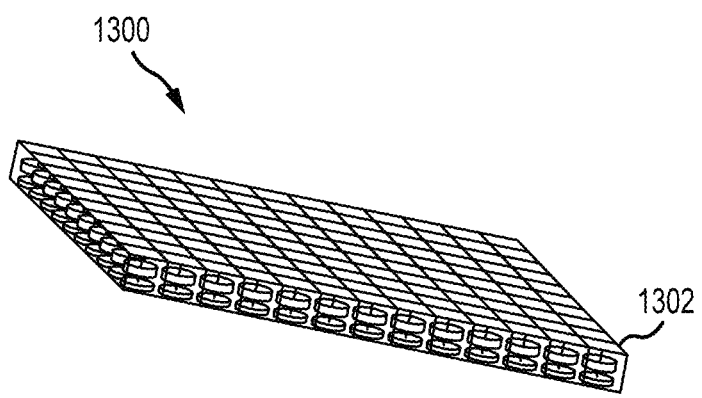
FIG. 13 illustrates a retroreflector including a number of unit cells in accordance with embodiments of the disclosure.

FIG. 13 illustrates a retroreflector including a number of unit cells in accordance with embodiments of the disclosure. As shown, a retroreflector 1300 may include a number of unit cells 1302 arranged in a flat 2D configuration.

The techniques described herein, therefore, provides efficient techniques for beamforming signals with metamaterial components. While there have been shown and described illustrative embodiments that provide for beamforming signals between source and target devices, it is to be understood that various other adaptations and modifications may be made within the spirit and scope of the embodiments herein. For example, the embodiments have been shown and described herein with the specific open cavity system configurations or components. However, the embodiments in their broader sense are not as limited to such configurations or components, and may, in fact, be used with any number of devices and similar configurations, as is appreciated by those skilled in the art. Accordingly, it is appreciated the features, structures, and operations associated with one embodiment may be applicable to or combined with the features, structures, or operations described in conjunction with another embodiment of this disclosure. Additionally, in many instances, well-known structures, materials, or operations are not shown or described in detail to avoid obscuring aspects of this disclosure.

Any ranges cited herein are inclusive. The terms "substantially" and "about" used throughout this Specification are used to describe and account for small fluctuations. For example, they can refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

Having described several embodiments, it will be recognized by those skilled in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Those skilled in the art will appreciate that the presently disclosed embodiments teach by way of example and not by limitation. Therefore, the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall in between.

What is claimed is:

1. An apparatus for transmission of acoustic signals between a transmitter and a receiver, the apparatus comprising:
    an electrical signal generator for generating low frequency electrical signals;
    a transmitter comprising a first retroreflector having a first array of subwavelength retroreflective elements at one end of an open cavity for transmitting the low frequency electrical signals and a first electroacoustic transducer adjacent to the first retroreflector for converting the low frequency electrical signals to acoustic signals; and
    a receiver comprising a second retroreflector having a second array of subwavelength retroreflective elements at an opposite end of the open cavity, the acoustic signals being in form of a beam directed toward the receiver.

2. The apparatus of claim 1, further comprising a second electroacoustic transducer adjacent to the second retroreflector for converting the acoustic signals to low frequency electrical signals.

3. The apparatus of claim 1, wherein the first electroacoustic transducer comprises one or more selected from the group consisting of piezoelectric transducer, dynamic loudspeaker, magnetostrictive transducer, electrostatic speaker, magnetostatic speaker, ionic conduction speaker, thermoacoustic speaker, rotary speaker, air motion transformer, and ferrofluidic transducer.

4. The apparatus of claim 1, wherein at least one of the first array of subwavelength retroreflective elements and the second array of subwavelength retroreflective elements comprises a retroreflective diffractive metasurface.

5. The apparatus of claim 1, wherein a receiver and a transmitter are configured to be movable relative to each other or relative to a reference object or orientable relative to each other or relative to a reference object.

6. The apparatus of claim 1, wherein at least one of the first array of subwavelength retroreflective elements and the second array of subwavelength retroreflective elements comprises a retroreflective phase-conjugating metasurface.

7. The apparatus of claim 1, further comprising a compound amplifier comprising a phase-preserving distributed amplification layer for amplifying the acoustic signals from the open cavity to form amplified acoustic signals, wherein the distributed amplification layer is inside or adjacent to the open cavity including the first and the second retroreflectors.

8. The apparatus of claim 7, wherein the distributed amplification layer comprises an array of subwavelength amplifying elements.

9. The apparatus of claim 7, wherein the distributed amplification layer is adjacent to the transmitter or structurally integrated with the transmitter.

10. The apparatus of claim 8, wherein the subwavelength amplifying elements comprise a 3-port circulator configured to isolate incoming electric signals from the outgoing electric signals.

11. The apparatus of claim 8, wherein the subwavelength amplifying elements comprise diodes configured to isolate incoming electric signals from the outgoing electric signals.

12. The apparatus of claim 8, wherein the subwavelength amplifying elements comprise a power combiner configured to combine a seed electrical signal with the incoming electrical signal returning from the open cavity and converted by the first acoustic transducer.

13. The apparatus of claim 7, wherein the phase-preserving distributed amplification layer comprises an acoustic metamaterial gain medium for amplification of acoustic signals.

14. The apparatus of claim 1, wherein each of the first and second array of subwavelength retroreflective elements has an average center-to-center inter-element spacing equal to or less than half of the wavelength of the acoustic signals, wherein each of the first and second arrays of subwavelength retroreflective elements has an average edge-to-edge inter-element spacing between two neighboring retroreflective elements equal to or less than half of the wavelength of the acoustic signals.

15. The apparatus of claim 1, wherein the acoustic signals have a wavelength ranging from 1 mm to 1 m, wherein the acoustic signals have a frequency ranging from 20 Hz to 20 kHz.

16. The apparatus of claim 1, wherein the open cavity between the transmitter and the receiver comprises one or more of an air-filled cavity, a water-filled cavity or at least one region filled with a gas and at least one region filled with a liquid.

17. The apparatus of claim 1, wherein the open cavity between the transmitter and the receiver is at least partially bounded by a solid material.

18. The apparatus of claim 1, wherein each of the first and the second retroreflectors has a diameter less than 10 times the wavelength of the acoustic signals.

19. The apparatus of claim 1, wherein the open cavity between the transmitter and the receiver is at least partially bounded by a reflective medium, wherein the reflective medium at least partially bounds the open cavity between the transmitter and the receiver and acts at least partially as a waveguide that assists wave transmission between the transmitter and the receiver.

20. The apparatus of claim 19, wherein the reflective medium includes a material selected from the group consisting of metal, fence, wall, and line of trees.

21. The apparatus of claim 1, wherein the spatial localization of the signals in the open cavity comprises a single beam or multiple beams.

22. The apparatus of claim 1, wherein the spatial localization of the signals in the open cavity comprises a multipath beam.

23. The apparatus of claim 1, wherein the spatial localization of the signals in the open cavity comprises one of a focused beam with a focus in the vicinity of the receiver, a focused beam with a focus in the vicinity of the transmitter, or a focused beam with a focus in the middle of the open cavity.

24. The apparatus of claim 1, wherein the open cavity between the transmitter and the receiver contains a reflective boundary, wherein the reflective boundary blocks all possible propagation paths between the transmitter and the receiver, wherein the transmission of signals between the transmitter and the receiver is enhanced by multiple reverberations of signals in the open cavity, which causes an increase in the power flux density inside the open cavity.

25. The apparatus of claim 1, wherein the acoustic signals are used to wirelessly transmit acoustic power, wirelessly transmit coded information, to sense the properties of the propagation channel inside the open cavity, or to remotely image at least a portion of the open cavity.

26. The apparatus of claim 7, wherein the open cavity including the first and the second retroreflectors and the phase-preserving distributed amplification layer is a resonator having a Q factor of at least 10.

27. The apparatus of claim 7, wherein the amplifier has a nonlinear input power dependency for the gain.

28. The apparatus of claim 7, wherein the amplified acoustic signals have the same phase as the acoustic signals incident upon the amplification layer from the open cavity.

29. The apparatus of claim 7, further comprising an adaptive gain controller to dynamically increase or decrease the amplitude gain of the amplifier based on a power estimate from a power sensor adjacent to or integrated with the amplifier or to dynamically change the orientation of the transmitter and/or receiver based on a power estimate from a power sensor adjacent to or integrated with the amplifier.

30. The apparatus of claim 7, wherein the amplifier is tunable and configured to produce a plurality of fixed gain curves that facilitate automatic mode locking.

31. The apparatus of claim 1, wherein at least one of the first and second arrays of subwavelength retroreflective elements is a substantially flat 2D array.

32. The apparatus of claim 1, wherein the receiver is at a distance less than a Fraunhofer distance from the transmitter, wherein the Fraunhofer distance for a round aperture is $2D^2/\lambda$, where D is the smaller value of a first diameter of the transmitter and a second diameter of the receiver.

33. The apparatus of claim 7, wherein the receiver is passive and is configured to receive an automatically formed beam based upon the amplified acoustic signals.

34. The apparatus of claim 1, wherein the receiver comprises a power absorbing layer, wherein the power absorbing layer is adjacent to the second retroreflector or structurally integrated with the second retroreflector.

35. The apparatus of claim 1, wherein each of the first and second retroreflectors comprises a 2D metasurface comprising patterned structure with a subwavelength thickness.

36. The apparatus of claim 1, further comprising one or more side retroreflectors along a path of the beam from the transmitter to the receiver for directing the signal toward the receiver.

37. The apparatus of claim 1, wherein the transmitter is configured to operate in a dual transmitting and receiving mode and to receive and transmit acoustic signals simultaneously to achieve time reversal beam forming.

38. The apparatus of claim 1, further comprising a phase-preserving amplifier comprising a metamaterial near the transmitter for amplifying the amplitude of the seed signal to form an amplified signal that is transmitted to a matched receiver.

39. A transmitting apparatus for transmitting acoustic signals to a matched receiver, the transmitting apparatus comprising:
   an electrical signal generator for generating low frequency electrical signals;
   a transmitter comprising a retroreflector having an array of subwavelength retroreflective elements at one end of an open cavity for transmitting the low frequency electrical signals; and
   an electroacoustic transducer adjacent to the retroreflector for converting the low frequency electrical signals from the transmitter to acoustic signals that travel through the open cavity to the receiver.

40. A receiving apparatus for receiving acoustic signals from a transmitter, the apparatus comprising a receiver comprising a retroreflector having an array of subwavelength retroreflective elements at an opposite end of the open cavity and an electroacoustic transducer adjacent to the retroreflector for converting acoustic signals that travel through the open cavity to low frequency electrical signals that are received by the receiver.

* * * * *